(12) United States Patent
Pendse

(10) Patent No.: US 9,472,533 B2
(45) Date of Patent: Oct. 18, 2016

(54) SEMICONDUCTOR DEVICE AND METHOD OF FORMING WIRE BONDABLE FAN-OUT EWLB PACKAGE

(71) Applicant: STATS ChipPAC, Ltd., Singapore (SG)

(72) Inventor: Rajendra D. Pendse, Fremont, CA (US)

(73) Assignee: STATS ChipPAC Pte. Ltd., Singapore (SG)

(*) Notice: Subject to any disclaimer, the term of this patent is extended or adjusted under 35 U.S.C. 154(b) by 0 days.

(21) Appl. No.: 14/548,064

(22) Filed: Nov. 19, 2014

(65) Prior Publication Data

US 2015/0140736 A1    May 21, 2015

Related U.S. Application Data

(60) Provisional application No. 61/906,857, filed on Nov. 20, 2013.

(51) Int. Cl.
| | |
|---|---|
| H01L 21/00 | (2006.01) |
| H01L 25/065 | (2006.01) |
| H01L 23/31 | (2006.01) |
| H01L 23/00 | (2006.01) |

(52) U.S. Cl.
CPC ....... *H01L 25/0657* (2013.01); *H01L 23/3107* (2013.01); *H01L 24/19* (2013.01); *H01L 24/97* (2013.01); *H01L 2224/48091* (2013.01); *H01L 2224/48228* (2013.01); *H01L 2224/73265* (2013.01); *H01L 2225/0651* (2013.01); *H01L 2225/06548* (2013.01); *H01L 2924/01322* (2013.01); *H01L 2924/12041* (2013.01); *H01L 2924/12042* (2013.01); *H01L 2924/12043* (2013.01); *H01L 2924/13091* (2013.01); *H01L 2924/181* (2013.01)

(58) Field of Classification Search
CPC ................ H01L 25/0657; H01L 2224/16145
USPC ....................................................... 438/109
See application file for complete search history.

(56) References Cited

U.S. PATENT DOCUMENTS

| | | | |
|---|---|---|---|
| 6,506,633 B1 * | 1/2003 | Cheng ..................... | H01L 24/24 257/E21.705 |
| 6,849,915 B1 * | 2/2005 | Tsai ..................... | H01L 31/0203 257/432 |
| 6,916,682 B2 * | 7/2005 | Gerber .................. | H01L 21/568 257/E21.525 |
| 7,830,020 B2 * | 11/2010 | Dahilig et al. ................ | 257/777 |
| 2005/0046003 A1 * | 3/2005 | Tsai .................. | H01L 23/49575 257/686 |
| 2008/0131999 A1 * | 6/2008 | Takiar et al. ................. | 438/109 |

(Continued)

*Primary Examiner* — Reema Patel
(74) *Attorney, Agent, or Firm* — Robert D. Atkins; Atkins and Associates, P.C.

(57) ABSTRACT

A semiconductor device has a first semiconductor die and a first encapsulant deposited over the first semiconductor die. An interconnect structure is formed over the first semiconductor die and first encapsulant. A modular interconnect structure including a conductive via is disposed adjacent to the first semiconductor die. The first encapsulant is deposited over the modular interconnect structure. An opening is formed in the first encapsulant extending to the modular interconnect structure or to the interconnect structure. A second semiconductor die is disposed over the first semiconductor die. A bond wire is formed over the second semiconductor die and extends into the opening in the first encapsulant. A cap is formed over an active region of the second semiconductor die. A second encapsulant is deposited over the second semiconductor die and bond wire. Alternatively, a lid is formed over the second semiconductor die and bond wire.

23 Claims, 24 Drawing Sheets

(56) References Cited

U.S. PATENT DOCUMENTS

| | | | |
|---|---|---|---|
| 2009/0026560 A1* | 1/2009 | Wombacher | H01L 23/055 257/415 |
| 2009/0321911 A1* | 12/2009 | Son | 257/686 |
| 2010/0203677 A1* | 8/2010 | Kwang | H01L 24/32 438/109 |
| 2011/0278736 A1 | 11/2011 | Lin et al. | |
| 2013/0099387 A1* | 4/2013 | Caskey et al. | 257/774 |
| 2013/0154108 A1 | 6/2013 | Lin et al. | |
| 2013/0249101 A1 | 9/2013 | Lin et al. | |
| 2013/0249106 A1 | 9/2013 | Lin et al. | |
| 2013/0249115 A1 | 9/2013 | Lin et al. | |
| 2014/0167262 A1* | 6/2014 | Yap | H01L 21/485 257/738 |

* cited by examiner

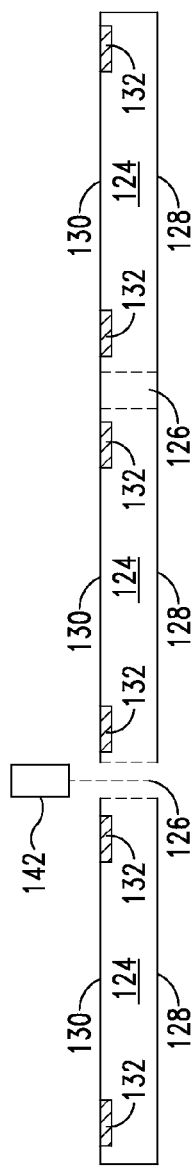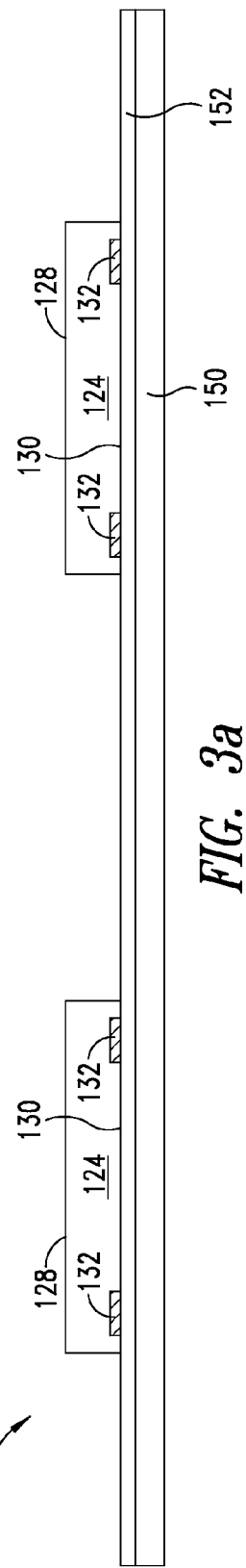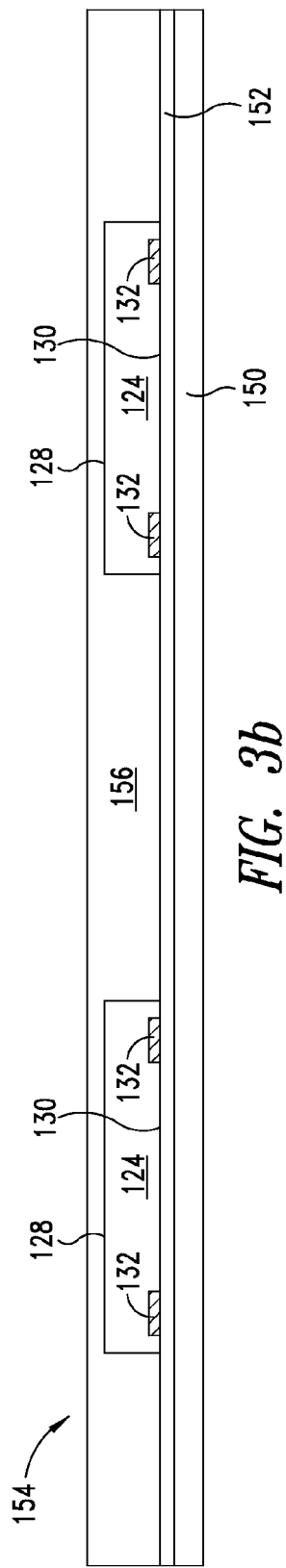

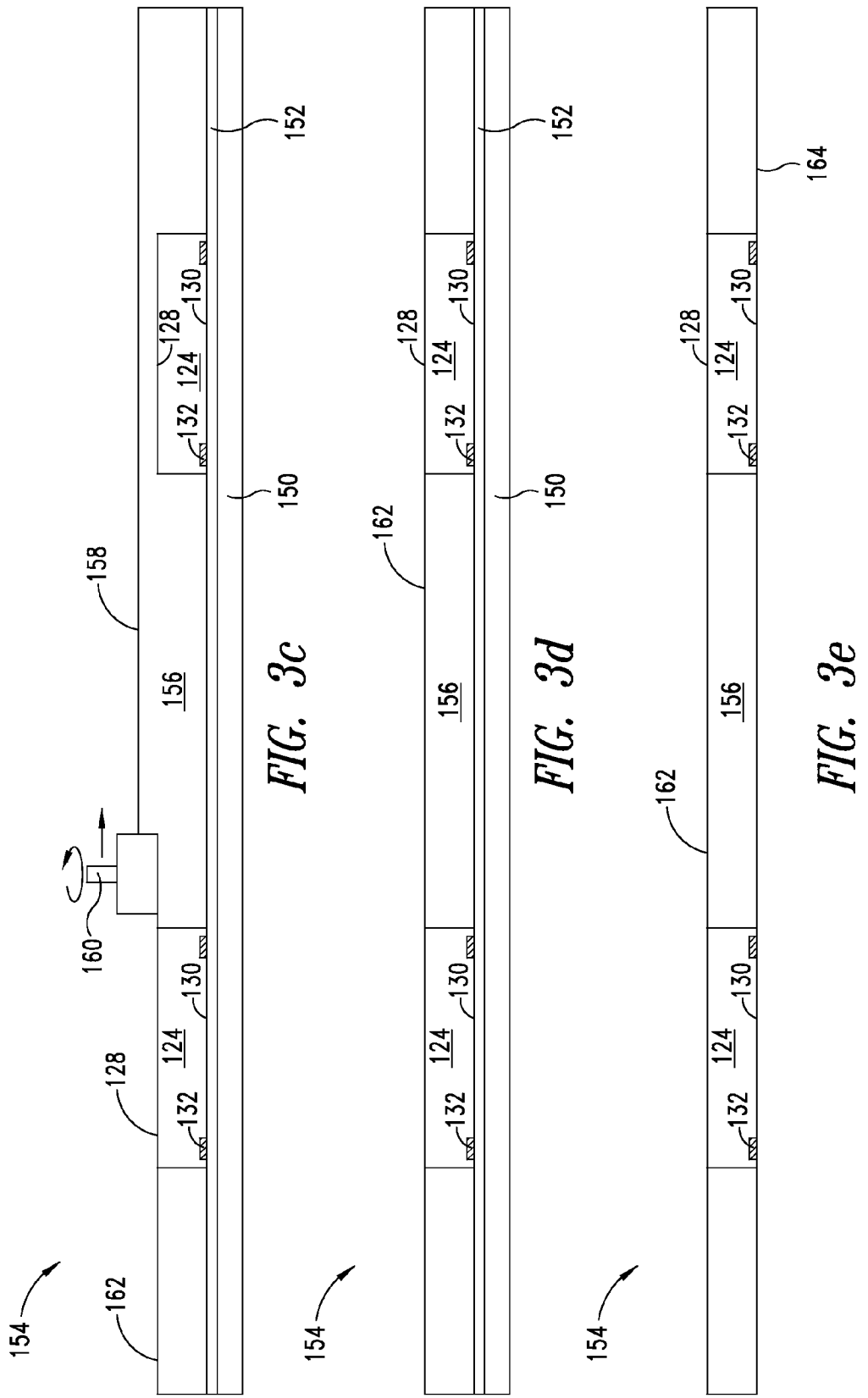

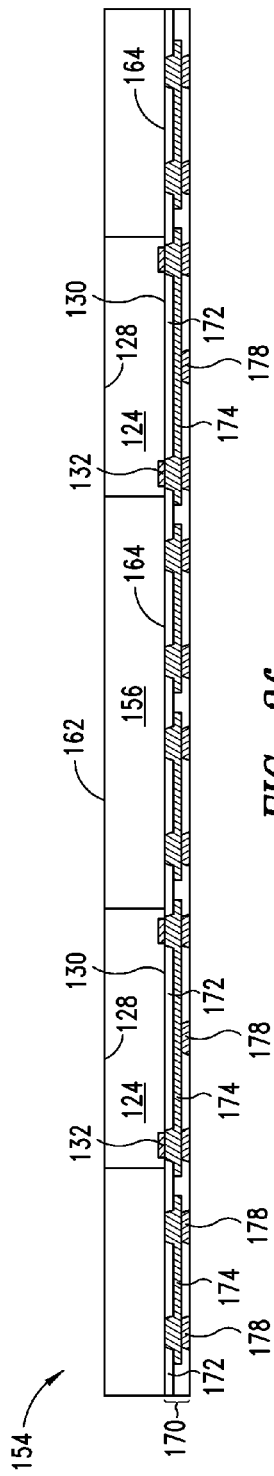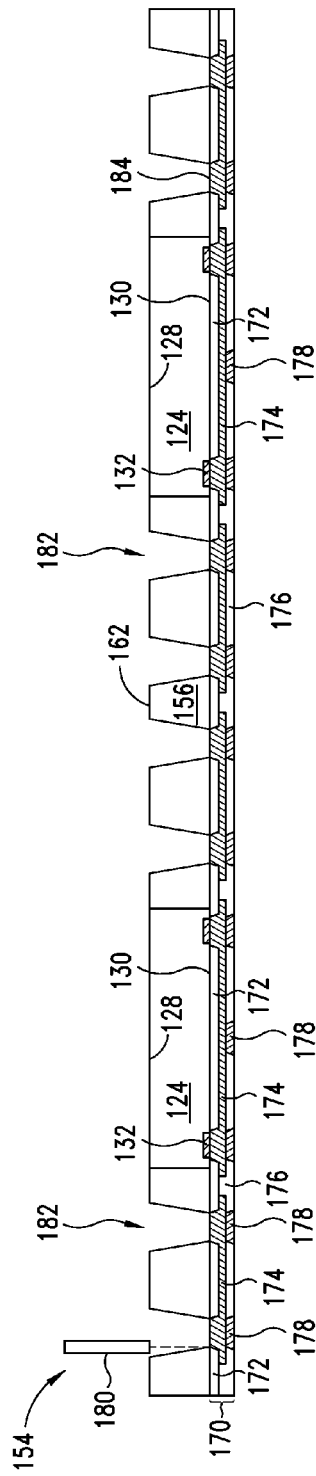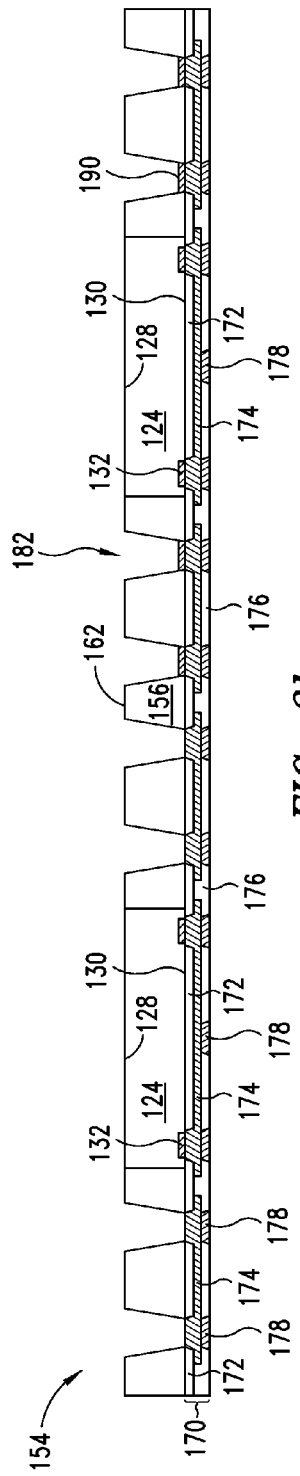

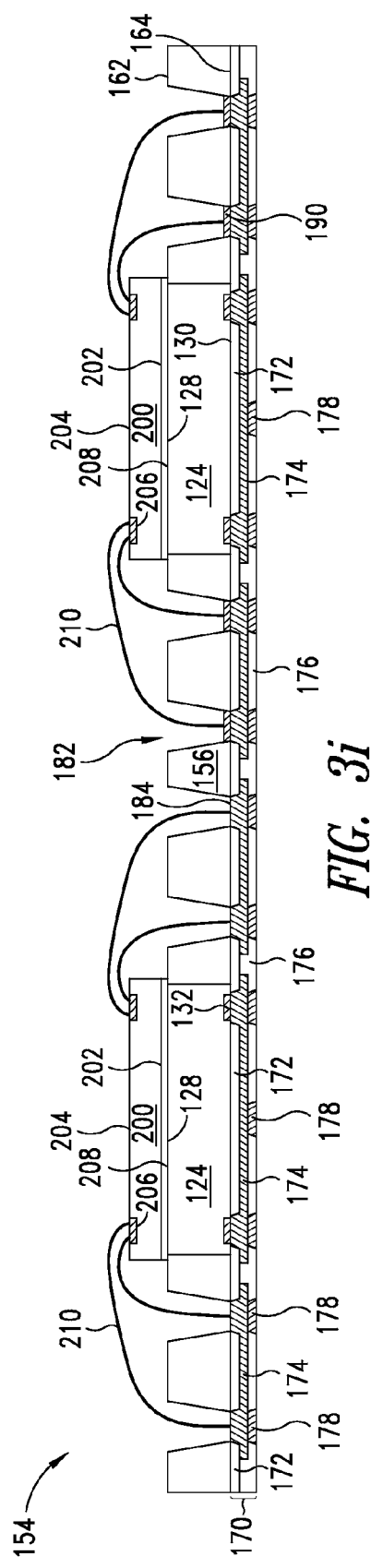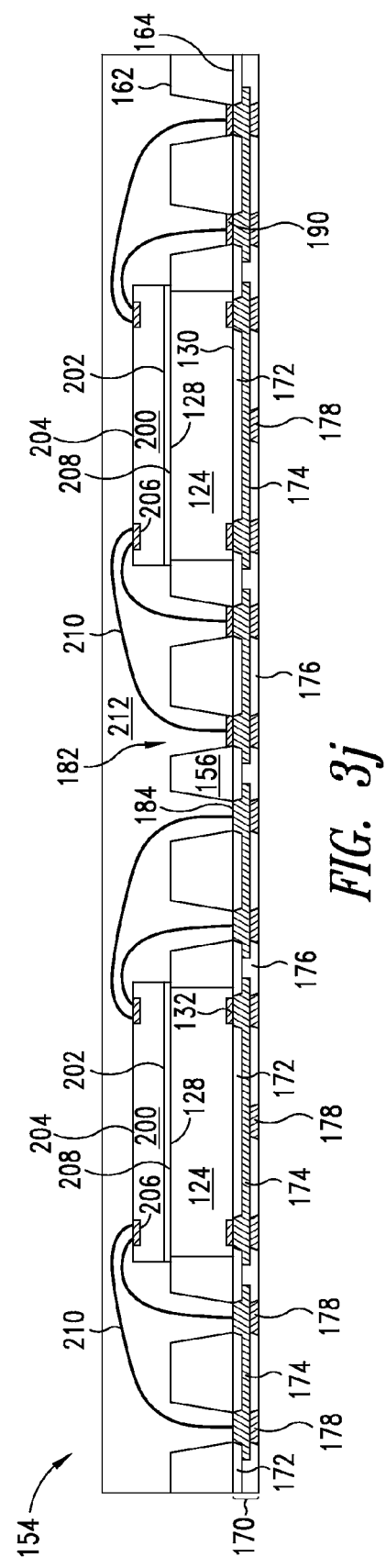

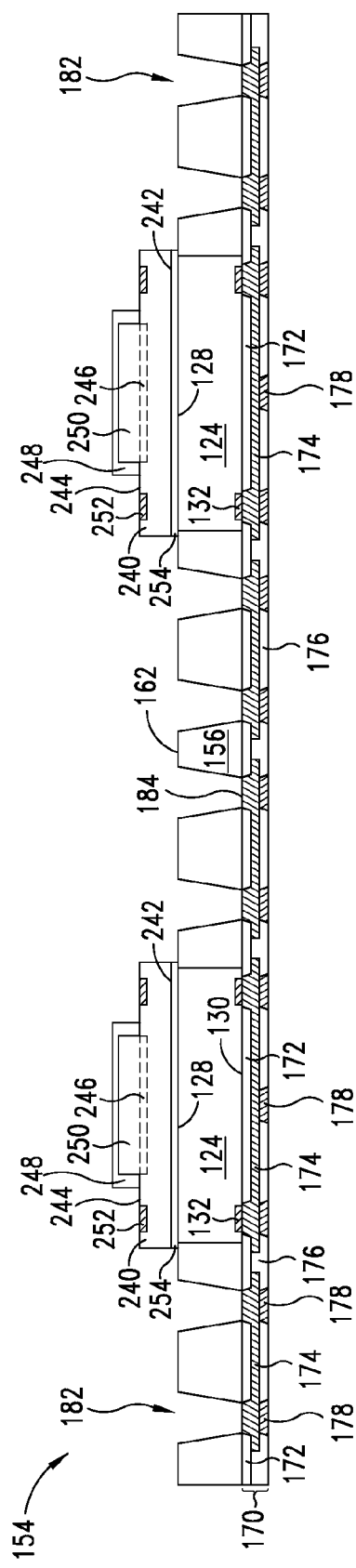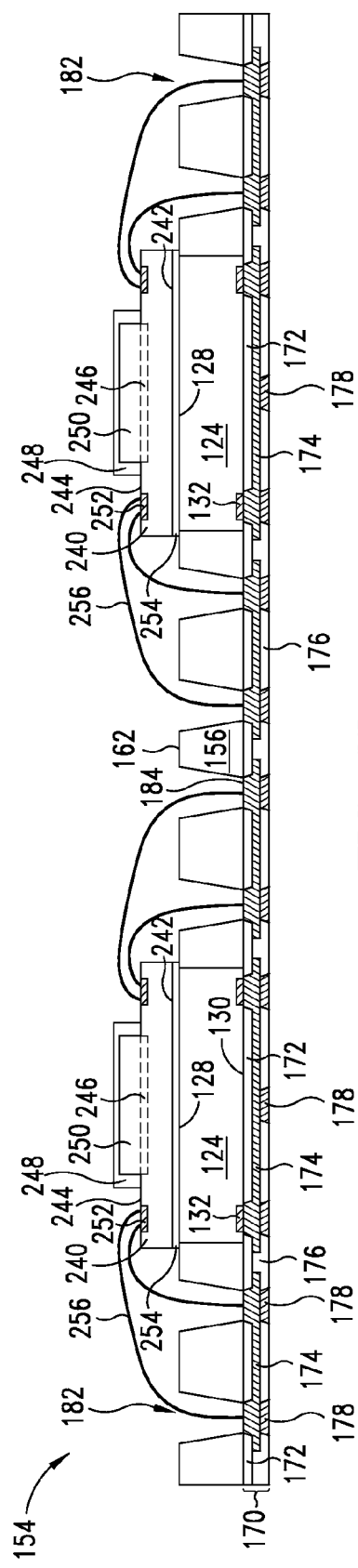

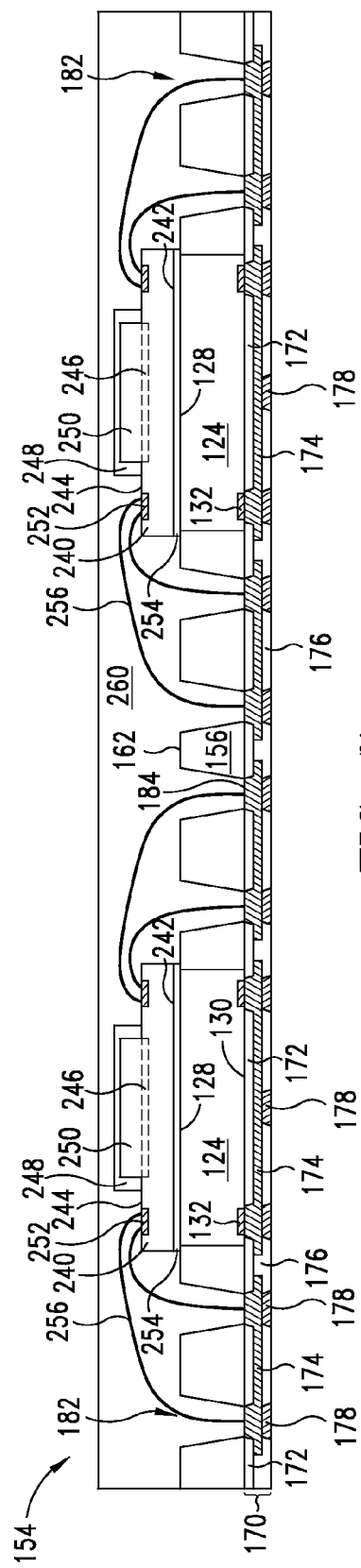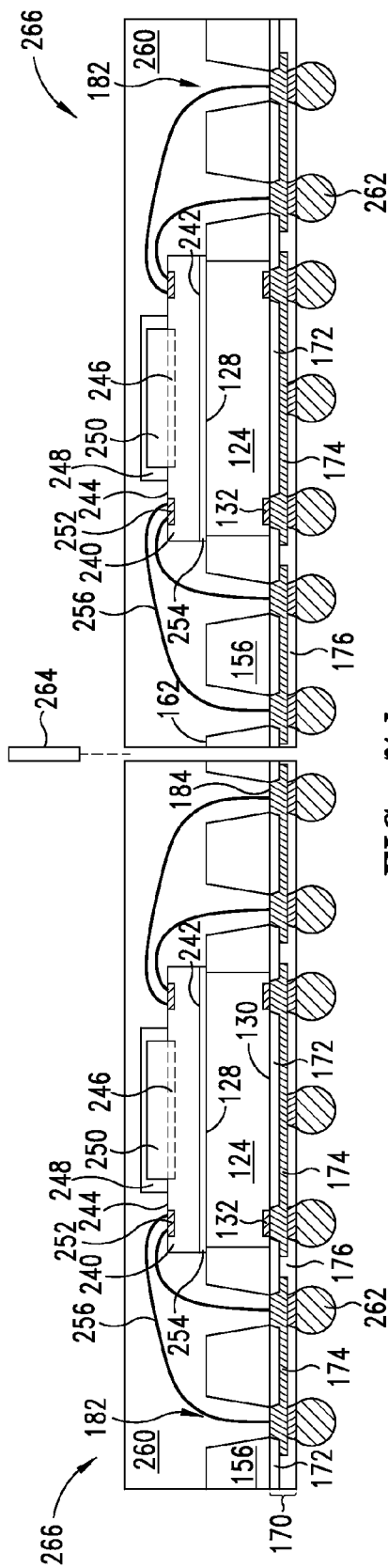

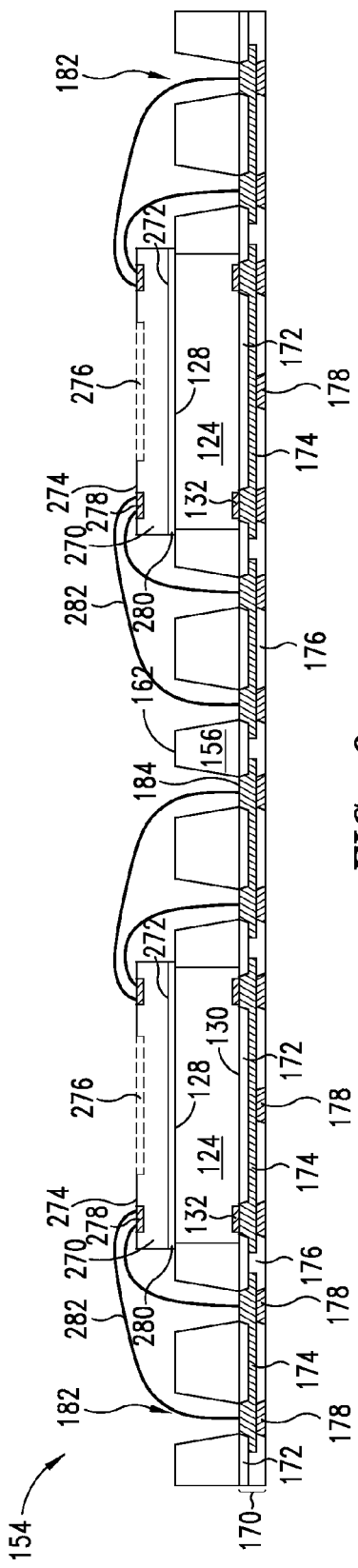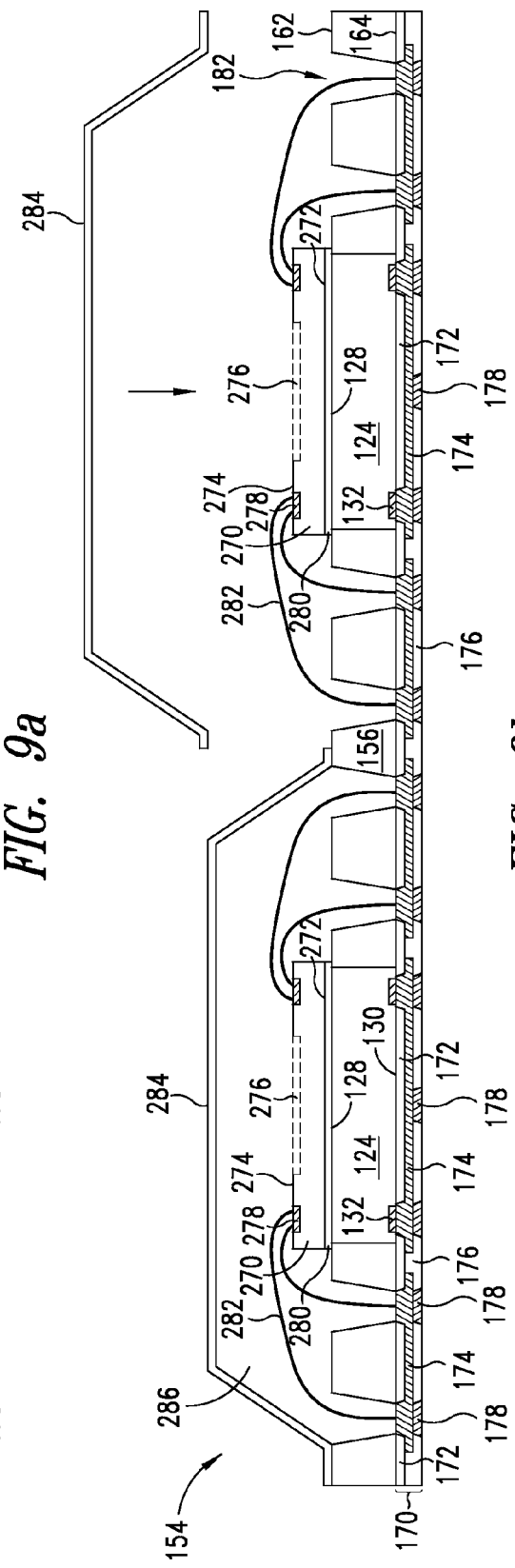

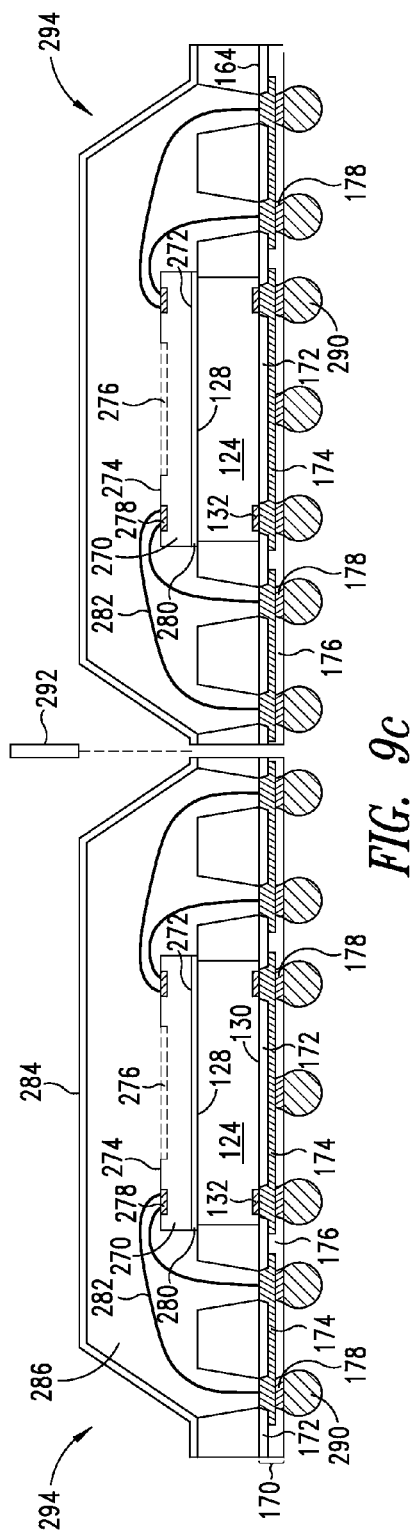
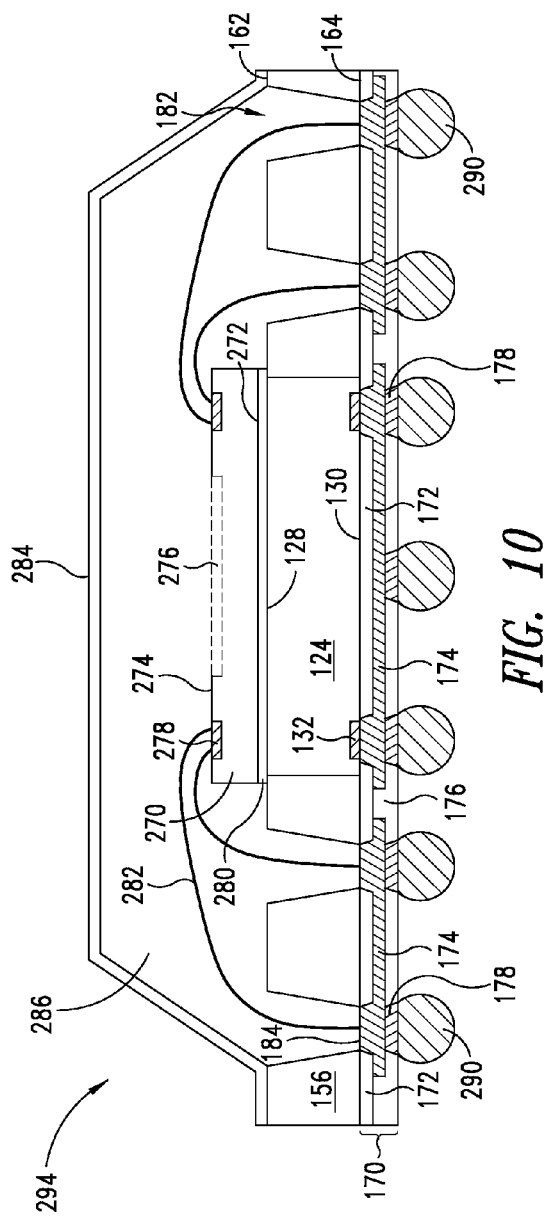
FIG. 9c
FIG. 10

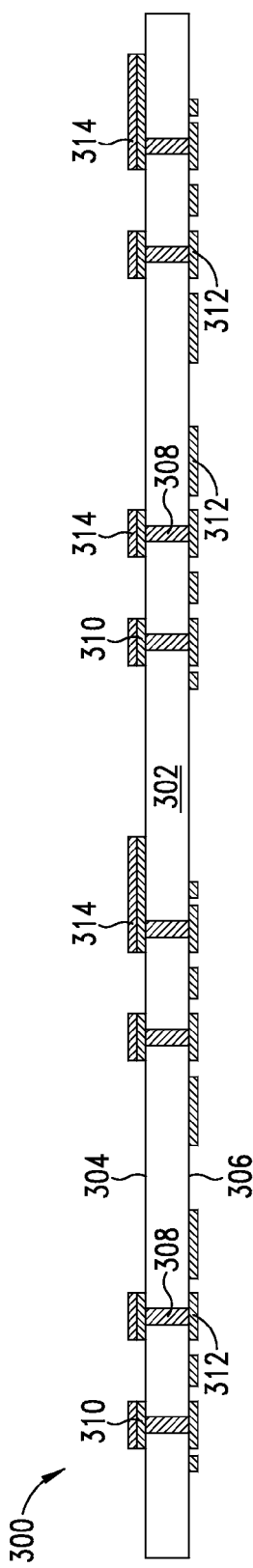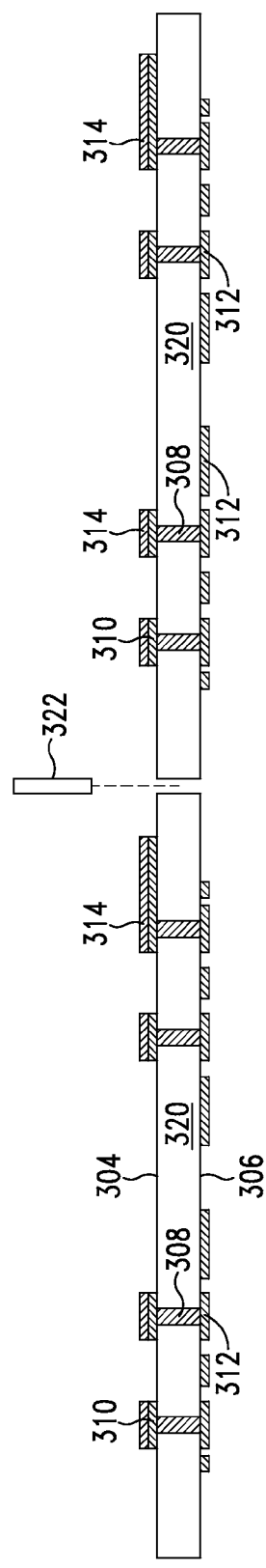

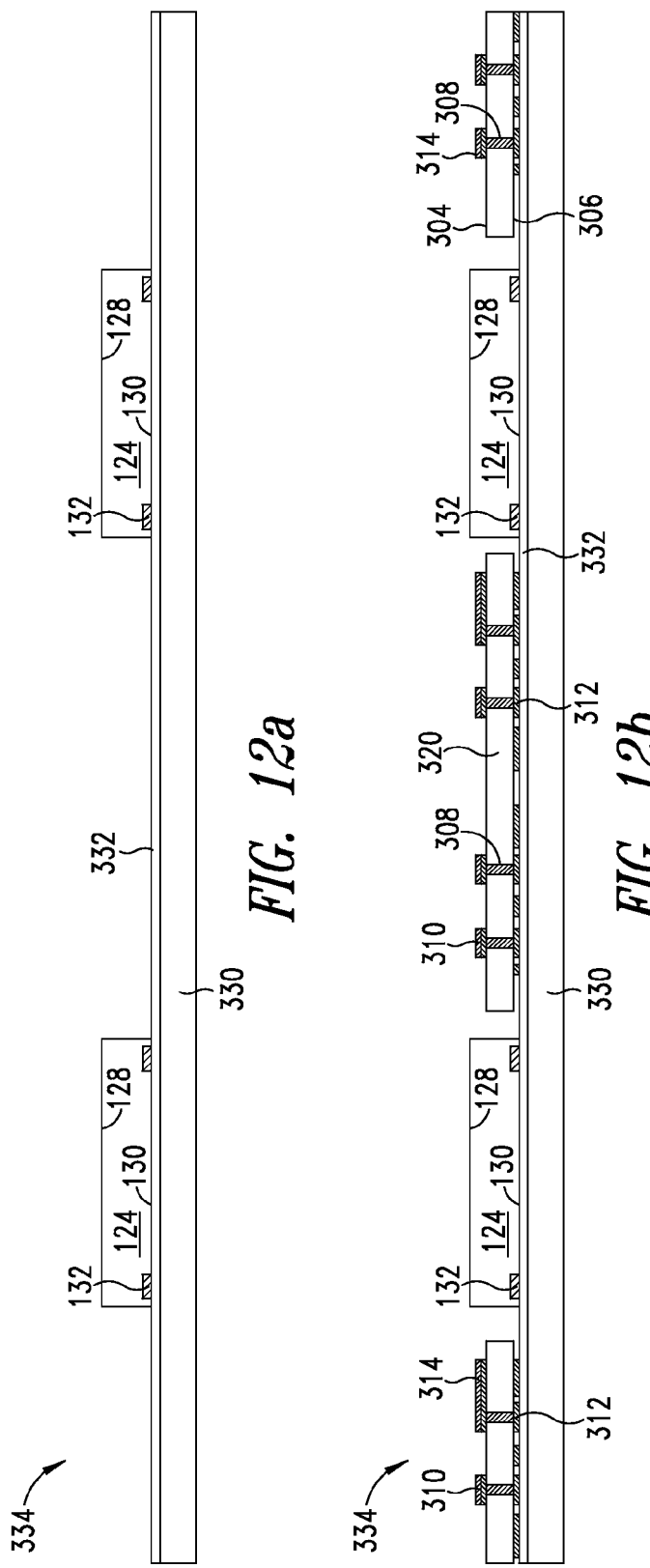

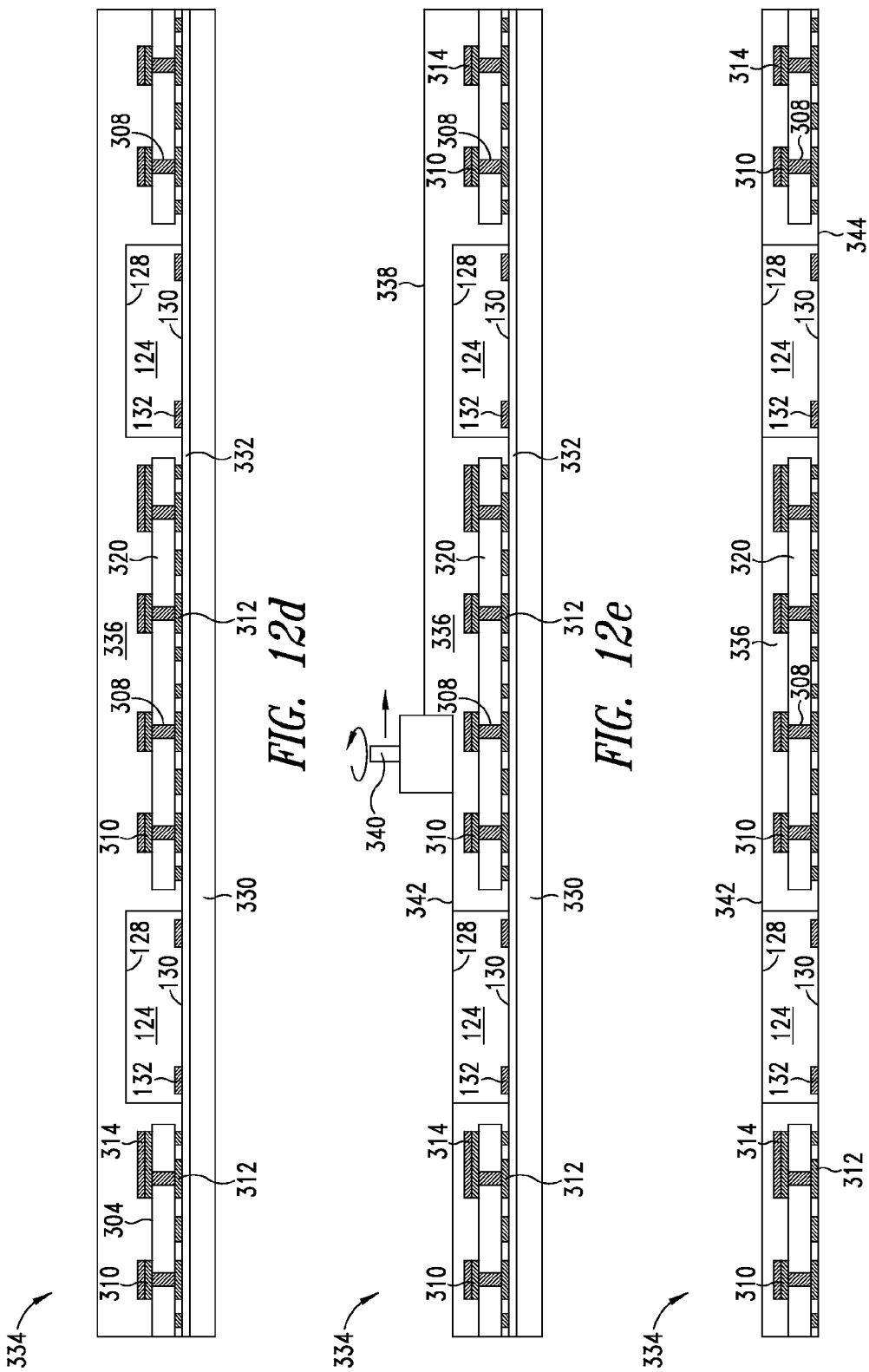

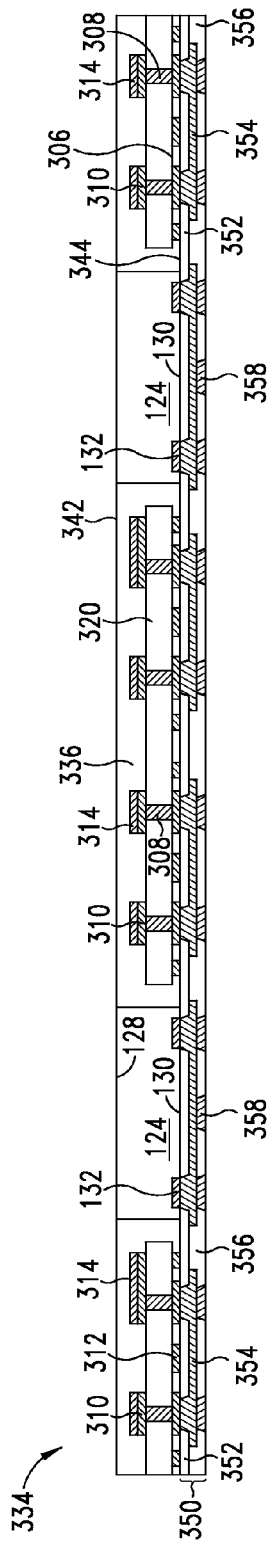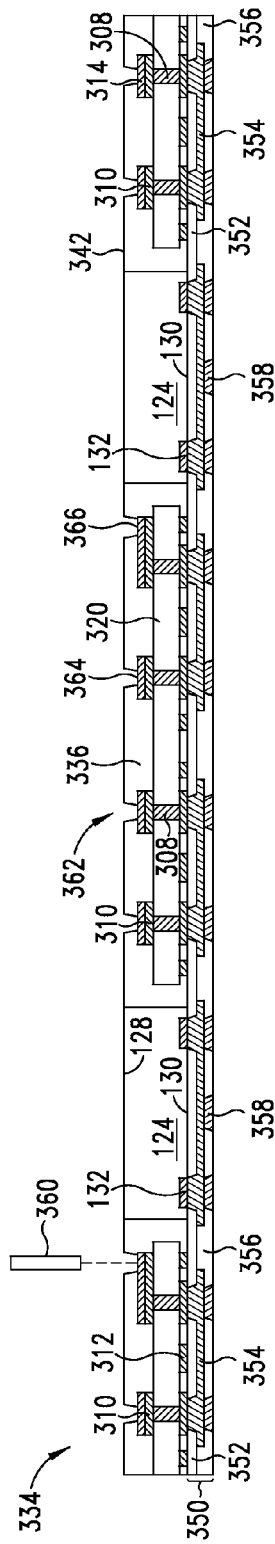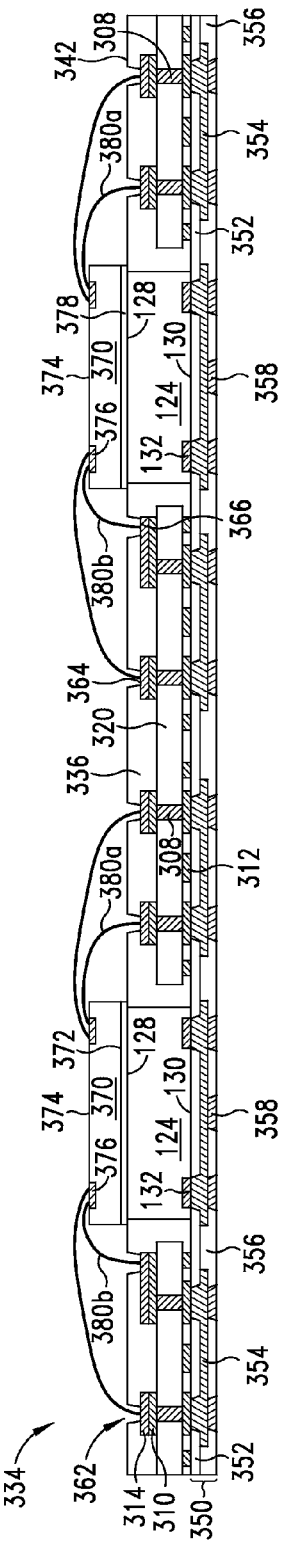

SEMICONDUCTOR DEVICE AND METHOD OF FORMING WIRE BONDABLE FAN-OUT EWLB PACKAGE

CLAIM OF DOMESTIC PRIORITY

The present application claims the benefit of U.S. Provisional Application No. 61/906,857, filed Nov. 20, 2013, which application is incorporated herein by reference.

FIELD OF THE INVENTION

The present invention relates in general to semiconductor devices and, more particularly, to a semiconductor device and method of forming a wire bondable fan-out embedded wafer level ball grid array (Fo-eWLB) for semiconductor die stacking.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving the objectives of greater integration and smaller semiconductor devices is to focus on three dimensional (3D) packaging technologies including package-on-package (PoP). The manufacturing of smaller semiconductor devices relies on implementing improvements to horizontal and vertical electrical interconnection between multiple semiconductor devices on multiple levels, i.e., 3D device integration. A reduced package profile is of particular importance for packaging in the cellular or smart phone industry. A flip chip hybrid package is used to integrate multiple semiconductor die by mounting a bottom semiconductor die in a flip chip orientation to a substrate. A top semiconductor die is mounted over the bottom semiconductor die. The substrate provides electrical interconnection between the semiconductor die and external devices. However, a reduction in package height for current PoP and flip chip hybrid packages is constrained by the thickness of the substrate and the flip chip interconnections. The substrate thickness increases the package profile, and the bumps between the bottom semiconductor die and substrate further increases the thickness of the device. Thus, current packages are limited in height reduction that can be achieved while integrating stacked semiconductor die.

SUMMARY OF THE INVENTION

A need exists for a thinner semiconductor package with integration of stacked semiconductor die. Accordingly, in one embodiment, the present invention is a method of making a semiconductor device comprising the steps of providing a first semiconductor die, depositing a first encapsulant over the first semiconductor die, forming an interconnect structure over the first semiconductor die and first encapsulant, forming an opening in the first encapsulant adjacent to the first semiconductor die, and forming a bond wire in the opening in the first encapsulant.

In another embodiment, the present invention is a method of making a semiconductor device comprising the steps of providing a first semiconductor die, depositing a first encapsulant over the first semiconductor die, forming an opening in the first encapsulant adjacent to the first semiconductor die, and forming a first interconnect structure in the opening in the first encapsulant.

In another embodiment, the present invention is a semiconductor device comprising a first semiconductor die. A first encapsulant is deposited over the first semiconductor die. A first interconnect structure is formed over the first semiconductor die and first encapsulant. A second interconnect structure is formed over the first encapsulant.

In another embodiment, the present invention is a semiconductor device comprising a first semiconductor die. A first encapsulant is deposited over the first semiconductor die. The first encapsulant includes an opening. A first interconnect structure is formed within the opening in the first encapsulant.

BRIEF DESCRIPTION OF THE DRAWINGS

FIGS. 2a-2d illustrate a semiconductor wafer with a plurality of semiconductor die separated by a saw street;

FIGS. 3a-3k illustrate a method of forming a wire bondable Fo-eWLB semiconductor package;

FIGS. 7a-7d illustrate a method of forming a wire bondable Fo-eWLB semiconductor package with a microelectromechanical system (MEMS);

FIGS. 9a-9c illustrate an alternative method of forming a wire bondable Fo-eWLB semiconductor package with a MEMS device;

FIG. 10 illustrates another semiconductor package including a MEMS semiconductor die stacked over a Fo-eWLB;

FIGS. 11a-11b illustrate a method of forming modular interconnect units with vertical interconnect structures for a Fo-eWLB;

FIGS. 12a-12k illustrate a method of forming a wire bondable Fo-eWLB semiconductor package with modular interconnect units;

DETAILED DESCRIPTION OF THE DRAWINGS

Figure 1:
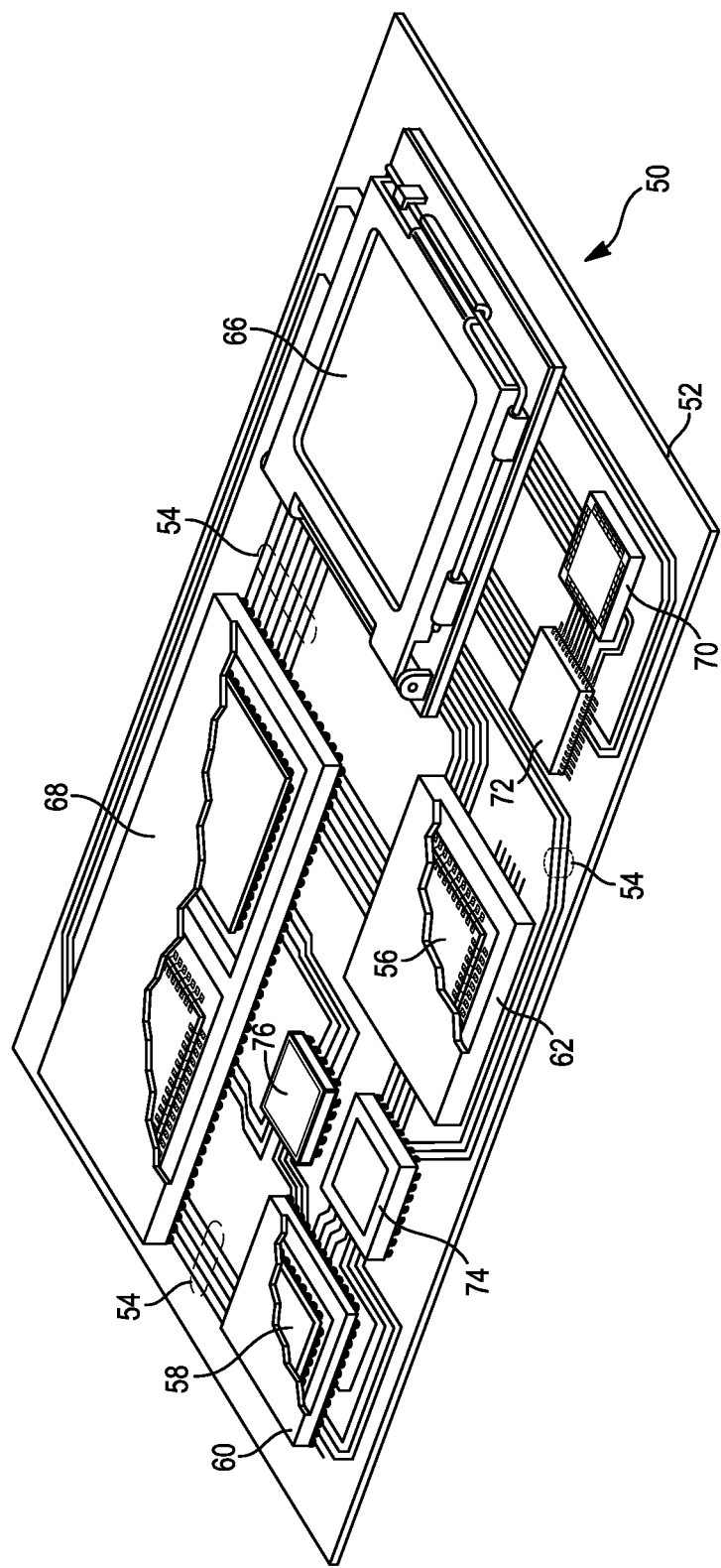
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), MEMS, logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
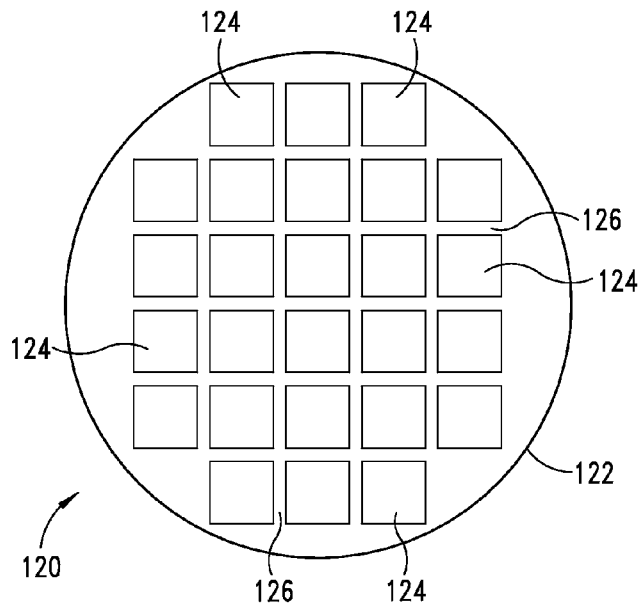

FIG. 2*a* shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
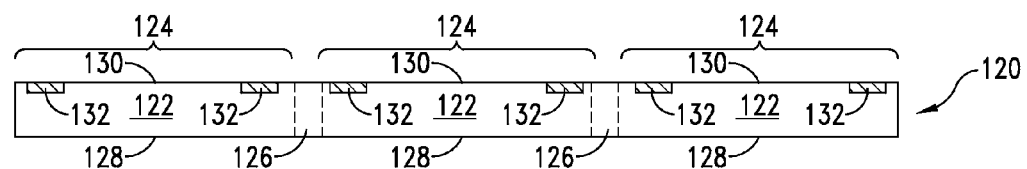

FIG. 2*b* shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, active surface 130 contains a MEMS, such as an accelerometer, gyroscope, strain gauge, microphone, or other sensor responsive to various external stimuli. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 includes one or more layers of aluminum (Al), copper (Cu), tin (Sn), nickel (Ni), gold (Au), silver (Ag), or other suitable electrically conductive material or combination thereof. Conductive layer 132 operates as contact pads electrically connected to the circuits on active surface 130. Conductive layer 132 is formed as contact pads disposed side-by-side a first distance from the edge of semiconductor die 124, as shown in FIG. 2*b*. Alternatively, conductive layer 132 is formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
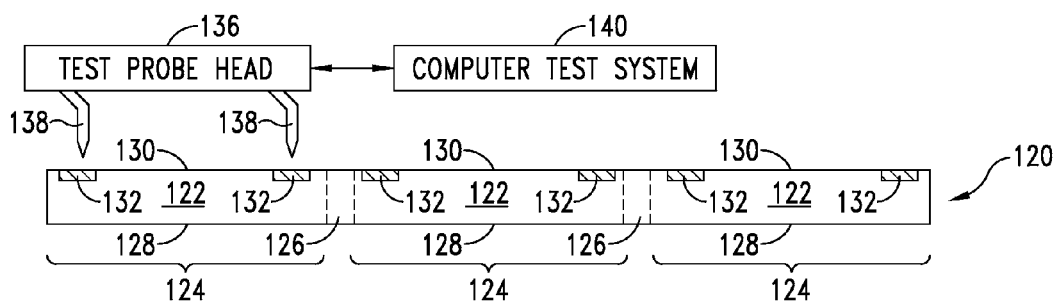

The active and passive components within semiconductor die 124 undergo testing at the wafer level for electrical performance and circuit function. Each semiconductor die 124 is tested for functionality and electrical parameters, as shown in FIG. 2*c*, using a test probe head 136 including a plurality of probes or test leads 138, or other testing device. Probes 138 are used to make electrical contact with nodes or conductive layer 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, semiconductor wafer 120 is singulated through saw street 126 using a saw blade or laser cutting tool 142 into individual semiconductor die 124. Individual semiconductor die 124 can be inspected and electrically tested for identification of KGD post singulation.

Figure 3K:
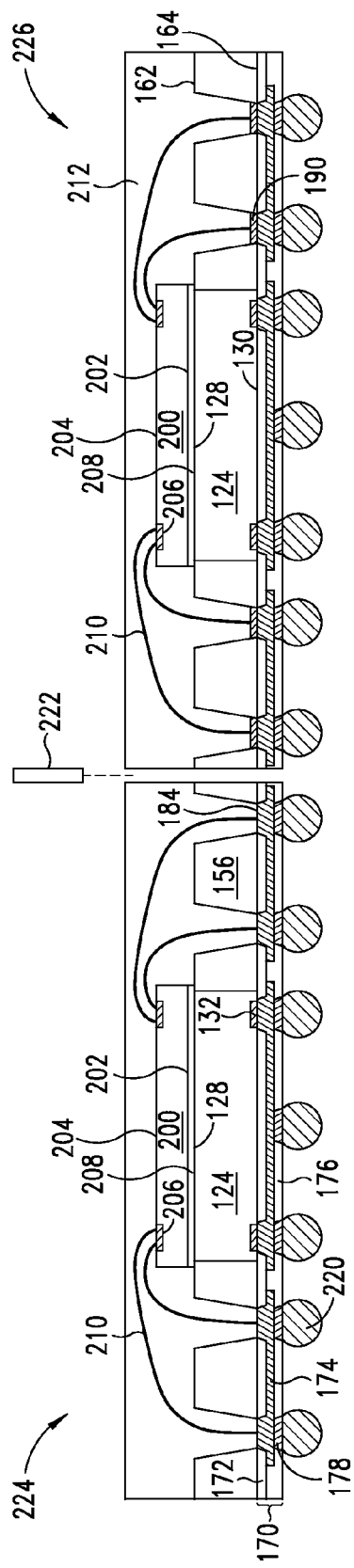

FIGS. 3a-3k illustrate, in relation to FIG. 1, a process of forming a wire bondable Fo-eWLB semiconductor package. FIG. 3a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Carrier 150 can be a round or rectangular panel (greater than 300 mm) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has a fixed or standardized size, which can accommodate various size semiconductor die 124 singulated from one or more semiconductor wafers 120. In one embodiment, carrier 150 is circular with a diameter of 330 mm. In another embodiment, carrier 150 is rectangular with a width of 560 mm and length of 600 mm. Semiconductor die 124 may have dimensions of 10 mm by 10 mm, which are placed on the standardized carrier 150. Alternatively, semiconductor die 124 may have dimensions of 5 mm by 5 mm, which are placed on the same standardized carrier 150. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 3a, semiconductor die 124 from FIG. 2d are mounted to interface layer 152 and over carrier 150 using, for example, a pick and place operation with active surface 130 oriented toward the carrier. FIG. 3a shows semiconductor die 124 mounted to interface layer 152 of carrier 150 as reconstituted panel or reconfigured wafer 154.

Reconstituted wafer or panel 154 can be processed into many types of semiconductor packages, including eWLB, fan-in WLCSP, reconstituted or embedded wafer level chip scale packages (eWLCSP), fan-out WLCSP, flipchip packages, three dimensional (3D) packages, package-on-package (PoP), or other semiconductor packages. Reconstituted panel 154 is configured according to the specifications of the resulting semiconductor package. In one embodiment, semiconductor die 124 are placed on carrier 150 in a high-density arrangement, i.e., 300 micrometers (μm) apart or less, for processing fan-in devices. The distance between semiconductor die 124 on carrier 150 is optimized for manufacturing the semiconductor packages at the lowest unit cost. The larger surface area of carrier 150 accommodates more semiconductor die 124 and lowers manufacturing cost as more semiconductor die 124 are processed per reconstituted panel 154. The number of semiconductor die 124 mounted to carrier 150 can be greater than the number of semiconductor die 124 singulated from semiconductor wafer 120. Carrier 150 and reconstituted panel 154 provide the flexibility to manufacture many different types of semiconductor packages using different size semiconductor die 124 from different sized semiconductor wafers 120.

In FIG. 3b, an encapsulant or molding compound 156 is deposited over semiconductor die 124 and carrier 150 as an insulating material using a paste printing, compressive molding, transfer molding, liquid encapsulant molding, vacuum lamination, spin coating, or other suitable applicator. In particular, encapsulant 156 covers the side surfaces and back surface 128 of semiconductor die 124. Encapsulant 156 includes polymer composite material, such as epoxy resin with filler, epoxy acrylate with filler, or polymer with proper filler. Encapsulant 156 is non-conductive and environmentally protects the semiconductor device from external elements and contaminants.

In FIG. 3c, a back surface 158 of encapsulant 156 undergoes an optional backgrinding operation with grinder 160 or other suitable mechanical or etching process to remove a portion of encapsulant 156 and expose back surface 128 of semiconductor die 124. A chemical etch, polishing, or CMP process can also be used to planarize encapsulant 156 and to remove mechanical damage resulting from the grinding operation. The removal of a portion of encapsulant 156 from back surface 158 leaves new back surface 162 of encapsulant 156. Surface 162 of encapsulant 156 is coplanar with back surface 128 of semiconductor die 124. In an alternative embodiment, encapsulant 156 remains covering back surface 128 of semiconductor die 124, for example, where reconstituted panel 154 does not undergo backgrinding.

FIG. 3d shows reconstituted panel 154 after the backgrinding process. In one embodiment, back surface 128 of semiconductor die 124 is exposed with respect to encapsulant 156. Surface 162 of encapsulant 156 and back surface 128 of semiconductor die 124 may undergo a polishing step to remove damage to base material 122 of semiconductor die 124.

In FIG. 3e, temporary carrier 150 and optional interface layer 152 are removed by chemical etching, mechanical peel-off, chemical mechanical planarization (CMP), mechanical grinding, thermal bake, laser scanning, or wet stripping. Surface 164 of encapsulant 156 and active surface 130 of semiconductor die 124 are exposed after carrier 150 and interface layer 152 are removed.

In FIG. 3f, a build-up interconnect structure 170 is formed over semiconductor die 124 and encapsulant 156. Interconnect structure 170 includes an insulating or passivation layer 172 containing one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), low temperature curable polymer dielectric resist (i.e., cures at less than 250° C.), benzocyclobutene (BCB), polybenzoxazoles (PBO), epoxy based photosensitive polymer dielectric, or other material having similar insulating and structural properties. Insulating layer 172 is formed over active surface 130 of semiconductor die 124 and surface 164 of encapsulant 156 using PVD, CVD, printing, spin coating, spray coating, sintering or thermal oxidation. A portion of insulating layer 172 is removed by an etching process to expose conductive layer 132 of semiconductor die 124 and a portion of surface 164 of encapsulant 156.

An electrically conductive layer 174 is formed over insulating layer 172, conductive layer 132, and encapsulant 156 using a patterning and metal deposition process such as PVD, CVD, sputtering, electrolytic plating, and electroless plating. Conductive layer 174 includes one or more layers of Al, Cu, Sn, Ni, Au, Ag, titanium (Ti), titanium tungsten (TiW), tungsten (W), or other suitable electrically conductive material or combination thereof. Conductive layer 174 operates as a redistribution layer (RDL) to redistribute electrical connection from semiconductor die 124 to outside a footprint of semiconductor die 124. One portion of conductive layer 174 is electrically connected to conductive layer 132 of semiconductor die 124. Other portions of conductive layer 174 are electrically common or electrically isolated depending on the design and function of the semiconductor device.

An insulating or passivation layer 176 is formed over insulating layer 172 and conductive layer 174 using PVD, CVD, printing, spin coating, spray coating, sintering or thermal oxidation. Insulating layer 176 includes one or more layers of SiO2, Si3N4, SiON, Ta2O5, Al2O3, low temperature curable polymer dielectric resist (i.e., cures at less than 250° C.), BCB, PBO, epoxy based photosensitive polymer dielectric, or other material having similar insulating and structural properties. A portion of insulating layer 176 is removed by an etching process to expose portions of conductive layer 174.

An electrically conductive layer 178 is formed over insulating layer 176 and conductive layer 174 using a patterning and metal deposition process such as PVD, CVD, sputtering, electrolytic plating, and electroless plating. Conductive layer 178 includes one or more layers of Al, Cu, Sn, Ni, Au, Ag, Ti, TiW, W, or other suitable electrically conductive material or combination thereof. Conductive layer 178 operates as an RDL or under bump metallization (UBM). Conductive layer 178 includes a multi-metal stack with an adhesion layer, a barrier layer, and a seed or wetting layer. One portion of conductive layer 178 is electrically connected to conductive layer 174. Other portions of conductive layer 178 are electrically common or electrically isolated depending on the design and function of the semiconductor device.

Interconnect structure 170 comprises insulating layers 172 and 176 and conductive layers 174 and 178 formed over active surface 130 of semiconductor die 124 and over surface 164 of encapsulant 156. Additional insulating layers and RDLs can be formed over insulating layer 176 and conductive layer 178 to provide additional vertical and horizontal electrical connectivity across the package according to the design and functionality of semiconductor die 124.

In FIG. 3g, a portion of encapsulant 156 is removed by laser direct ablation (LDA) using laser 180 to form openings or vias 182 extending down to conductive layer 174 of interconnect structure 170. In one embodiment, laser 180 includes an ultra violet (UV) laser, carbon dioxide (CO2) laser, or other suitable laser for LDA. In one embodiment, laser 180 is used in a pulsed laser mode for selective LDA removal of encapsulant 156. Alternatively, openings 182 are formed by an etching process through a patterned photoresist layer, plasma etching, wet etching, high energy water jetting, or other suitable process. Openings 182 are formed adjacent to, in a peripheral region of, and outside a footprint of semiconductor die 124. Openings 182 extend completely through encapsulant 156 from surface 162 to surface 164 of encapsulant 156. Openings 182 extend to conductive layer 174 and expose surface 184 of conductive layer 174 for subsequent electrical interconnection through encapsulant 156. Openings 182 have a footprint or cross-sectional area that is circular, oval, square, rectangular, or any other geometric shape. In one embodiment, openings 182 include sloped sidewalls forming a tapered shape with a larger diameter at the top of opening 182 and a smaller diameter at the bottom of opening 182. In another embodiment, openings 182 include vertical sidewalls. Openings 182 provide for subsequent electrical interconnect for stacked semiconductor die to interconnect structure 170.

In FIG. 3h, after openings 182 are formed, openings 182 and exposed surface 184 of conductive layer 174 are treated or cleaned to enhance the wire bondable surface 184 for subsequent wire bonding to conductive layer 174. Openings 182 and surface 184 of conductive layer 174 undergo a cleaning process, such as plasma cleaning or wet etching. A residue-free surface 184 of conductive layer 174 provides improved wire bonding and electrical continuity for stacked die. In another embodiment, surface 184 of conductive layer 174 is treated by forming a wire bondable layer over conductive layer 174. An electrically conductive layer 190 is optionally formed within openings 182 over exposed surface 184 of conductive layer 174 using a patterning and metal deposition process such as PVD, CVD, sputtering, electrolytic plating, and electroless plating. Conductive layer 190 includes one or more layers of Ni, Au, Al, Cu, Sn, Ag or other suitable electrically conductive material or combination thereof. In one embodiment, conductive layer 190 operates as a wire bondable layer for subsequent electrical interconnection.

In FIG. 3i, semiconductor die 200 are disposed over and mounted to back surface 128 of semiconductor die 124 and surface 162 of encapsulant 156 using, for example, a pick and place operation with back surface 202 of semiconductor die 200 oriented toward semiconductor die 124. Each semiconductor die 200 has a back or non-active surface 202 and an active surface 204 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 204 to implement analog circuits or digital circuits, such as DSP, ASIC, MEMS, memory, or other signal processing circuit. In one embodiment, active surface 204 contains a MEMS, such as an accelerometer, gyroscope, strain gauge, microphone, or other sensor responsive to various external stimuli. Semiconductor die 200 may also contain IPDs, such as inductors, capacitors, and resistors, for RF signal processing.

Semiconductor die 200 includes an electrically conductive layer 206 formed over active surface 204 using PVD, CVD, electrolytic plating, electroless plating process, or other suitable metal deposition process. Conductive layer 206 includes one or more layers of Al, Cu, Sn, Ni, Au, Ag, or other suitable electrically conductive material or combination thereof. Conductive layer 206 operates as contact pads electrically connected to the circuits on active surface 204. Conductive layer 206 is formed as contact pads disposed side-by-side a first distance from the edge of semiconductor die 200. Alternatively, conductive layer 206 is formed as contact pads that are offset in multiple rows such that a first row of contact pads is disposed a first distance from the edge of the die, and a second row of contact pads alternating with the first row is disposed a second distance from the edge of the die.

A plurality of semiconductor die 200 is disposed over and mounted to semiconductor die 124 and encapsulant 156 with die attach adhesive or film 208, such as epoxy resin. Semiconductor die 200 is mounted to semiconductor die 124 and encapsulant 156 at the reconstituted wafer-level or panel-level in a chip-on-wafer assembly. Semiconductor die 200 is a KGD having been tested prior to mounting to reconstituted panel 154. In another embodiment, die attach adhesive 208 includes a thermal interface material (TIM) such as thermal epoxy, thermal epoxy resin, thermal conductive paste, aluminum oxide, zinc oxide, boron nitride, pulverized silver, or thermal grease. Die attach adhesive 208 is cured to secure semiconductor die 200 to semiconductor die 124 and encapsulant 156.

A plurality of bond wires 210 is formed between interconnect structure 170 and contact pads 206 of semiconductor die 200. Prior to wire bonding, reconstituted panel 154 including semiconductor die 200 undergoes an optional cleaning process, such as plasma cleaning or wet cleaning, to remove contamination. Bond wires 210 are mechanically and electrically coupled to conductive layer 174 of interconnect structure 170 and to contact pads 206 of semiconductor die 200 by thermocompression bonding, ultrasonic bonding, wedge bonding, stitch bonding, ball bonding, or other suitable bonding technique. Bond wires 210 include a conductive material such as Cu, Al, Au, Ag, metal alloy, or a combination thereof. Semiconductor die 200 are electrically connected to interconnect structure 170 using bond wires 210. In one embodiment, an end of bond wire 210 is bonded to contact pads 206 of semiconductor die 200. Where conductive layer 190 is formed over conductive layer 174, an end of bond wire 210 opposite contact pads 206 is bonded to conductive layer 190 within openings 182. Without conductive layer 190, bond wires 210 are bonded directly to surface 184 of conductive layer 174. Bond wires 210 extend from semiconductor die 200 into openings 182 in encapsulant 156 to interconnect structure 170. Bond wires 210 represent one type of interconnect structure that electrically couples semiconductor die 200 to interconnect structure 170.

In another embodiment, an electrically conductive layer, such as an RDL, is used instead of bond wires 210 to electrically couple semiconductor die 200 to interconnect structure 170. For example, after mounting semiconductor die 200, an electrically conductive layer including one or more layers of Al, Cu, Sn, Ni, Au, Ag, Ti, TiW, W, or other suitable electrically conductive material or combination thereof is formed over semiconductor die 200 using a patterning and metal deposition process such as PVD, CVD, sputtering, electrolytic plating, electroless plating, or screen printing. The conductive layer operates as a backside RDL to redistribute electrical connection from semiconductor die 200 to outside a footprint of semiconductor die 200. The conductive layer is formed over contact pads 206 on active surface 204 of semiconductor die 200, over a side surface of semiconductor die 200, over encapsulant 156 and into openings 182 down to conductive layer 190 or conductive layer 174 in order to electrically connect semiconductor die 200 to interconnect structure 170.

In FIG. 3*j*, an encapsulant or molding compound 212 is deposited over semiconductor die 124 and 200, bond wires 210, encapsulant 156, and interconnect structure 170 using a paste printing, compressive molding, transfer molding, liquid encapsulant molding, vacuum lamination, spin coating, or other suitable applicator. Encapsulant 212 includes polymer composite material, such as epoxy resin with filler, epoxy acrylate with filler, or polymer with proper filler. Encapsulant 212 is non-conductive and environmentally protects the semiconductor device from external elements and contaminants.

In FIG. 3*k*, an electrically conductive bump material is deposited over interconnect structure 170 and electrically connected to conductive layer 178 using an evaporation, electrolytic plating, electroless plating, ball drop, or screen printing process. The bump material includes Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form spherical balls or bumps 220. In some applications, bumps 220 are reflowed a second time to improve electrical contact to conductive layer 178. The bumps can also be compression bonded to conductive layer 178. Bumps 220 represent one type of interconnect structure that is formed over conductive layer 178. The interconnect structure can also use bond wires, stud bump, micro bump, or other electrical interconnect. Bumps 220 or other interconnect structures are optional, and in one embodiment, are not formed over interconnect structure 170. For example, interconnect structure 170 without bumps 220 operates as an LGA.

Reconstituted panel 154 is singulated with saw blade or laser cutting device 222 through encapsulant 156, encapsulant 212, and interconnect structure 170 into individual semiconductor devices or Fo-eWLB packages 224 and 226.

Figure 4:
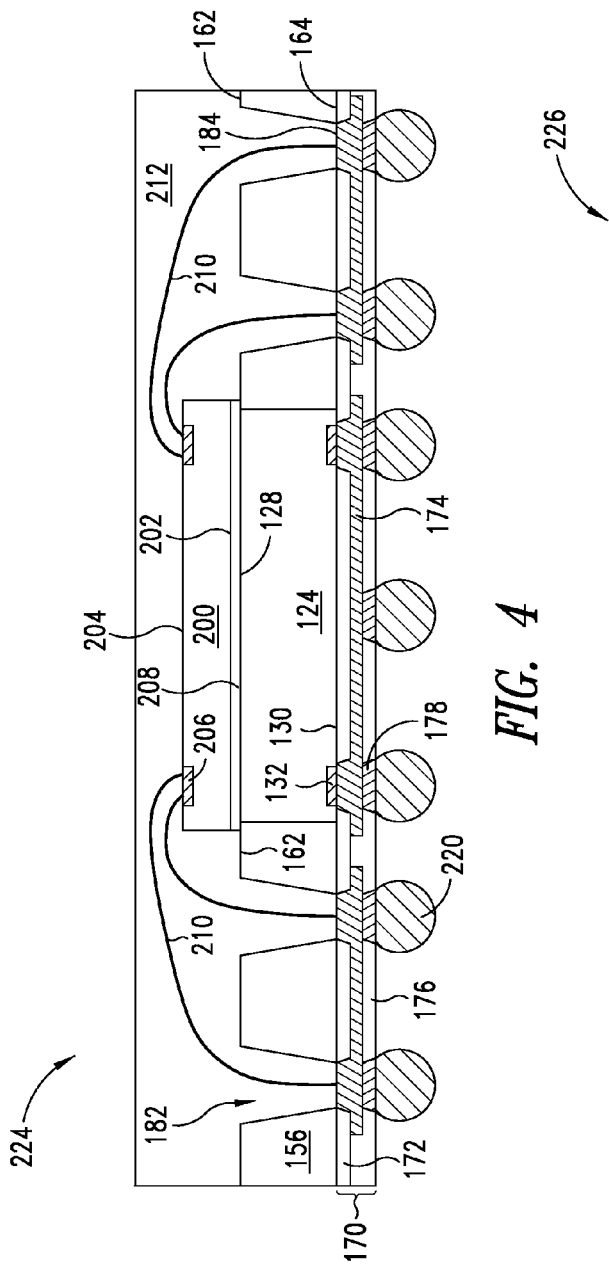
FIG. 4 illustrates a semiconductor package including a wire bonded semiconductor die stacked over a Fo-eWLB.

FIG. 4 shows Fo-eWLB package 224 after singulation. Fo-eWLB package 224 includes a wire bonded semiconductor die 200 stacked over a Fo-eWLB. Encapsulant 156 is formed over semiconductor die 124, and back surface 128 of semiconductor die 124 is exposed with respect to encapsulant 156. Interconnect structure 170 is formed over semiconductor die 124 and encapsulant 156 to extend electrical interconnection of semiconductor die 124 to outside a footprint of the die. Interconnect structure 170 includes insulating layers 172 and 176, conductive layers 174 and 178, and may include fewer or additional conductive and insulating layers. Openings 182 in encapsulant 156 provide for wire bonding through encapsulant 156 to interconnect structure 170. Semiconductor die 200 is mounted directly to semiconductor die 124 with die attach adhesive 208. Die attach adhesive 208 allows heat transfer between semiconductor die 124 and semiconductor die 200 to improve the thermal performance of Fo-eWLB package 224. In one embodiment, semiconductor die 124 includes an application or baseband mobile processor and semiconductor die 200 includes a memory device. In another embodiment, semiconductor die 124 includes a memory device and semiconductor die 200 includes an application or baseband mobile processor. Bond wires 210 electrically couple semiconductor die 200 to conductive layer 174 and interconnect structure 170. Encapsulant 212 is deposited over semiconductor die 124 and 200, bond wires 210, encapsulant 156, and interconnect structure 170. Bumps 220 are optionally formed over conductive layer 178 of interconnect structure 170 prior to singulating reconstituted panel 154 into Fo-eWLB packages 224. Semiconductor die 124 is electrically connected to external devices through interconnect structure 170 and bumps 220.

Semiconductor die 200 is electrically connected to semiconductor die 124 and to external devices through bond wires 210, interconnect structure 170, and bumps 220.

Fo-eWLB package 224 with build-up interconnect structure 170 provides a reduced package thickness compared to current semiconductor packages having substrate interposers and a thickness of 0.6-0.7 mm. In one embodiment, a thickness of Fo-eWLB package 224 is within a range of approximately 0.4-0.5 mm. Interconnect structure 170 of Fo-eWLB package 224 includes a thickness of approximately 0.04 mm, while a conventional substrate includes a thickness of approximately 0.13 mm. Thus, a thickness of the bottom interconnect in Fo-eWLB package 224 is reduced by approximately 0.09 mm. In a conventional semiconductor package, the bump height between a flip chip die and substrate contributes approximately 0.05 mm in standoff height. Fo-eWLB package 224 eliminates the need for bumps to be formed between semiconductor die 124 and the bottom interconnect, because interconnect structure 170 is formed directly on semiconductor die 124, thereby further reducing the package height. The design of Fo-eWLB package 224 results in a 15-20% or greater reduction in package thickness. Additionally, Fo-eWLB package 224 is formed using reconstituted panel 154 on standardized carrier 150. Therefore, Fo-eWLB package 224 is manufactured using standardized processing tools, equipment, and bill of materials, thereby reducing the cost to manufacture Fo-eWLB package 224 compared to flip chip hybrid packages.

Figure 5:
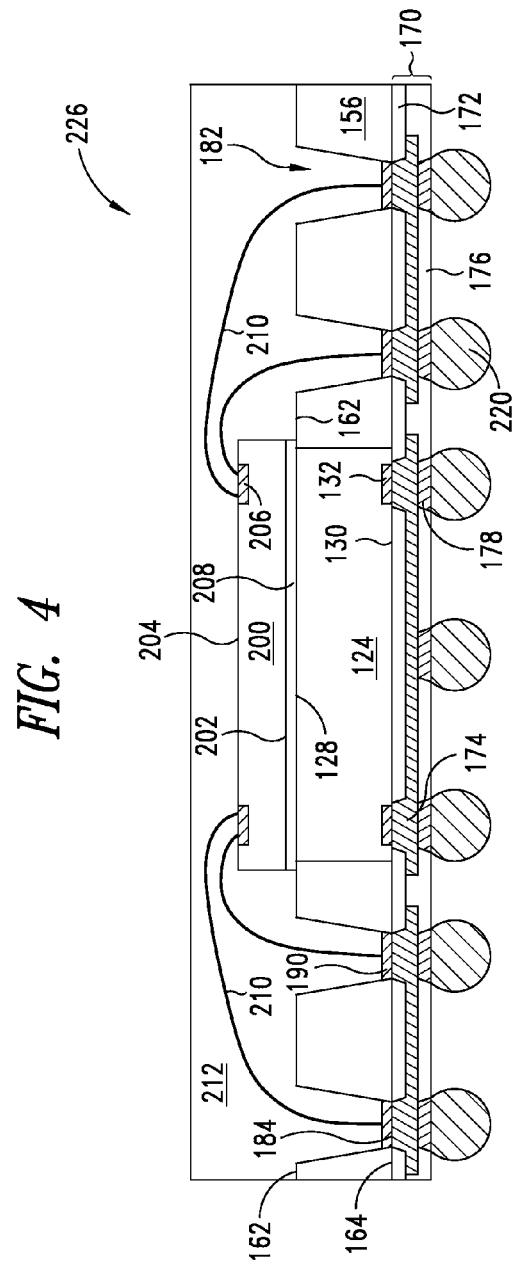
FIG. 5 illustrates another semiconductor package including a wire bonded semiconductor die stacked over a Fo-eWLB.

FIG. 5 shows Fo-eWLB package 226 after singulation. Fo-eWLB package 226 includes a wire bonded semiconductor die 200 stacked over a Fo-eWLB. Encapsulant 156 is formed over semiconductor die 124, and back surface 128 of semiconductor die 124 is exposed with respect to encapsulant 156. Interconnect structure 170 is formed over semiconductor die 124 and encapsulant 156 to extend electrical interconnection of semiconductor die 124 to outside a footprint of the die. Interconnect structure 170 includes insulating layers 172 and 176, conductive layers 174 and 178, and may include fewer or additional conductive and insulating layers. Openings 182 in encapsulant 156 provide for wire bonding through encapsulant 156 to interconnect structure 170. Conductive layer 190 is formed within openings 182 over conductive layer 174 of interconnect structure 170. Semiconductor die 200 is mounted directly to semiconductor die 124 with die attach adhesive 208. Die attach adhesive 208 allows heat transfer between semiconductor die 124 and semiconductor die 200 to improve the thermal performance of Fo-eWLB package 226. In one embodiment, semiconductor die 124 includes an application or baseband mobile processor and semiconductor die 200 includes a memory device. In another embodiment, semiconductor die 124 includes a memory device and semiconductor die 200 includes an application or baseband mobile processor. Bond wires 210 electrically couple semiconductor die 200 to conductive layer 190 and interconnect structure 170. Conductive layer 190, such as Au or Ni plating, operates as a surface treatment on surface 184 of conductive layer 174 that results in an improved wire-bondable surface. Encapsulant 212 is deposited over semiconductor die 124 and 200, bond wires 210, encapsulant 156, and interconnect structure 170. Bumps 220 are optionally formed over conductive layer 178 of interconnect structure 170 prior to singulating reconstituted panel 154 into Fo-eWLB packages 226. Semiconductor die 124 is electrically connected to external devices through interconnect structure 170 and bumps 220. Semiconductor die 200 is electrically connected to semiconductor die 124 and to external devices through bond wires 210, conductive layer 190, interconnect structure 170, and bumps 220.

Fo-eWLB package 226 with interconnect structure 170 provides a reduced package thickness compared to current semiconductor packages having substrate interposers and a thickness of 0.6-0.7 mm. In one embodiment, a thickness of Fo-eWLB package 226 is within a range of approximately 0.4-0.5 mm. Interconnect structure 170 of Fo-eWLB package 226 includes a thickness of approximately 0.04 mm, while a conventional substrate includes a thickness of approximately 0.13 mm. Thus, a thickness of the bottom interconnect in Fo-eWLB package 226 is reduced by approximately 0.09 mm. In a conventional semiconductor package, the bump height between a flip chip die and substrate contributes approximately 0.05 mm in standoff height. Fo-eWLB package 226 eliminates the need for bumps to be formed between semiconductor die 124 and the bottom interconnect, because interconnect structure 170 is formed directly on semiconductor die 124, thereby further reducing the package height. The design of Fo-eWLB package 226 results in a 15-20% or greater reduction in package thickness. Additionally, Fo-eWLB package 226 is formed using reconstituted panel 154 on standardized carrier 150. Therefore, Fo-eWLB package 226 is manufactured using standardized processing tools, equipment, and bill of materials, thereby reducing the cost to manufacture Fo-eWLB package 226 compared to flip chip hybrid packages.

Figure 6:
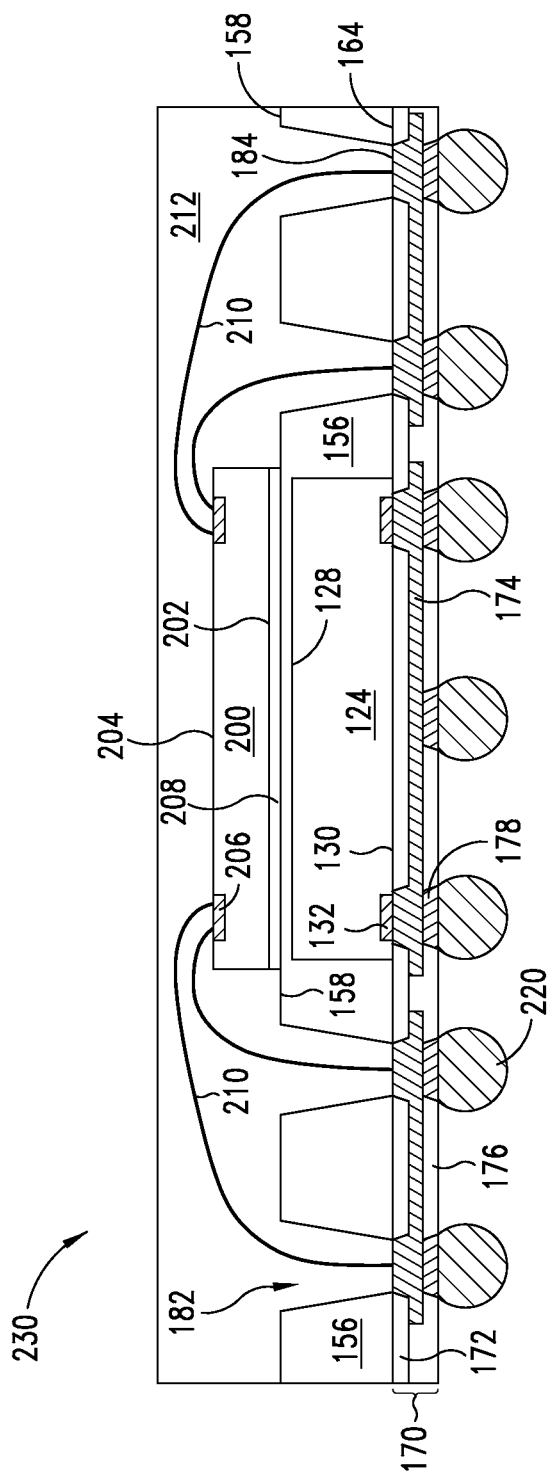
FIG. 6 illustrates a semiconductor package including a wire bonded semiconductor die mounted to encapsulant of a Fo-eWLB.

FIG. 6 shows a Fo-eWLB package 230. Fo-eWLB package 230 includes a wire bonded semiconductor die 200 stacked over encapsulant 156 of a Fo-eWLB. Encapsulant 156 is formed over and around semiconductor die 124. To reduce the cost of Fo-eWLB package 230, the optional backgrinding step is eliminated and encapsulant 156 remains covering semiconductor die 124. Interconnect structure 170 is formed over semiconductor die 124 and encapsulant 156 to extend electrical interconnection of semiconductor die 124 to outside a footprint of the die. Interconnect structure 170 includes insulating layers 172 and 176, conductive layers 174 and 178, and may include fewer or additional conductive and insulating layers. Openings 182 in encapsulant 156 provide for wire bonding through encapsulant 156 to interconnect structure 170. Semiconductor die 200 is disposed over and mounted to back surface 158 of encapsulant 156 with die attach adhesive 208. In one embodiment, semiconductor die 124 includes an application or baseband mobile processor and semiconductor die 200 includes a memory device. In another embodiment, semiconductor die 124 includes a memory device and semiconductor die 200 includes an application or baseband mobile processor. Bond wires 210 electrically couple semiconductor die 200 to conductive layer 174 and interconnect structure 170. Encapsulant 212 is deposited over semiconductor die 124 and 200, bond wires 210, encapsulant 156, and interconnect structure 170. Bumps 220 are optionally formed over conductive layer 178 of interconnect structure 170 prior to singulating reconstituted panel 154 into Fo-eWLB packages 230. Semiconductor die 124 is electrically connected to external devices through interconnect structure 170 and bumps 220. Semiconductor die 200 is electrically connected to semiconductor die 124 and to external devices through bond wires 210, interconnect structure 170, and bumps 220.

Fo-eWLB package 230 with interconnect structure 170 provides a reduced package thickness compared to current semiconductor packages having substrate interposers and a thickness of 0.6-0.7 mm. In one embodiment, a thickness of Fo-eWLB package 230 is less than approximately 0.6 mm.

Interconnect structure 170 of Fo-eWLB package 230 includes a thickness of approximately 0.04 mm, while a conventional substrate includes a thickness of approximately 0.13 mm. Thus, a thickness of the bottom interconnect in Fo-eWLB package 230 is reduced by approximately 0.09 mm. In a conventional semiconductor package, the bump height between a flip chip die and substrate contributes approximately 0.05 mm in standoff height. Fo-eWLB package 230 eliminates the need for bumps to be formed between semiconductor die 124 and the bottom interconnect, because interconnect structure 170 is formed directly on semiconductor die 124, thereby further reducing the package height. The design of Fo-eWLB package 230 results in a 15-20% or greater reduction in package thickness. Fo-eWLB package 230 is manufactured at a lower cost by removing the step of backgrinding encapsulant 156. Additionally, Fo-eWLB package 230 is formed using reconstituted panel 154 on standardized carrier 150. Therefore, Fo-eWLB package 230 is manufactured using standardized processing tools, equipment, and bill of materials, thereby reducing the cost to manufacture Fo-eWLB package 230 compared to flip chip hybrid packages.

FIGS. 7a-7d illustrate, in relation to FIG. 1, a method of making a wire bonded eWLB package including a MEMS device. FIG. 7a continues from FIG. 3g and shows a semiconductor die 240 disposed over and mounted to back surface 128 of semiconductor die 124 and to surface 162 of encapsulant 156 using, for example, a pick and place operation with back surface 242 of semiconductor die 240 oriented toward semiconductor die 124. Alternatively, where encapsulant 156 remains covering semiconductor die 124, semiconductor die 240 is mounted to encapsulant 156 over semiconductor die 124.

Each semiconductor die 240 has a back or non-active surface 242 and an active surface 244 containing an active region 246. In one embodiment, active region 246 of semiconductor die 240 includes a MEMS or other active or passive sensors responsive to various external stimuli. An active sensor, such as a photodiode, a phototransistor, or a Hall effect device, generates or controls the flow of electrical current in response to an external stimulus. A passive sensor, such as a photoresistor, thermistor, capacitive accelerometer, or load cell, alters the relationship between voltage and current in response to the external stimulus. The external stimulus can be light, sound, electromagnetic radiation, electric field, magnetic field, ionizing radiation, vibration, motion, acceleration, rotation, orientation, pressure, or temperature. Active region 246 may include piezoelectric and nanoelectronic devices. Active region 246 is electrically connected to other analog and digital circuits on active surface 244 of semiconductor die 240 to perform functions in response to the external stimulus. In another embodiment, active region 246 may contain analog or digital circuits implemented as active devices, passive devices, conductive layers, and dielectric layers formed within the die and electrically interconnected according to the electrical design and function of the die.

A cover or cap 248 is disposed over active region 246 of semiconductor die 240. Cap 248 contains glass, silicon, or other suitable base material. Cap 248 completely covers active region 246 and is attached to active surface 244 with a sealing material to form a cavity 250 over active region 246 of semiconductor die 240. Cavity 250 operates as a sealed area directly over active region 246 to protect active region 246.

Semiconductor die 240 includes an electrically conductive layer 252 formed over active surface 244 using PVD, CVD, electrolytic plating, electroless plating process, or other suitable metal deposition process. Conductive layer 252 includes one or more layers of Al, Cu, Sn, Ni, Au, Ag, or other suitable electrically conductive material or combination thereof. Conductive layer 252 operates as contact pads electrically connected to the circuits on active surface 244. Conductive layer 252 is formed as contact pads disposed side-by-side a first distance from the edge of semiconductor die 240. Alternatively, conductive layer 252 is formed as contact pads that are offset in multiple rows such that a first row of contact pads is disposed a first distance from the edge of the die, and a second row of contact pads alternating with the first row is disposed a second distance from the edge of the die.

A plurality of semiconductor die 240 is disposed over and mounted to semiconductor die 124 and encapsulant 156 with die attach adhesive or film 254, such as epoxy resin. Semiconductor die 240 is mounted to semiconductor die 124 and encapsulant 156 at the reconstituted wafer-level or panel-level in a chip-on-wafer assembly. Semiconductor die 240 is a KGD having been tested prior to mounting to reconstituted panel 154. In another embodiment, die attach adhesive 254 includes a TIM such as thermal epoxy, thermal epoxy resin, thermal conductive paste, aluminum oxide, zinc oxide, boron nitride, pulverized silver, or thermal grease. Die attach adhesive 254 is cured to secure semiconductor die 240 to semiconductor die 124 and encapsulant 156.

In FIG. 7b, a plurality of bond wires 256 is formed between interconnect structure 170 and contact pads 252 of semiconductor die 240. Prior to wire bonding, reconstituted panel 154 including semiconductor die 240 undergoes an optional cleaning process, such as plasma cleaning or wet cleaning, to remove contamination. Bond wires 256 are mechanically and electrically coupled to conductive layer 174 of interconnect structure 170 and to contact pads 252 of semiconductor die 240 by thermocompression bonding, ultrasonic bonding, wedge bonding, stitch bonding, ball bonding, or other suitable bonding technique. Bond wires 256 include a conductive material such as Cu, Al, Au, Ag, metal alloy, or a combination thereof. An end of bond wire 256 is bonded to contact pads 252 of semiconductor die 240. In one embodiment, an optional conductive layer is formed within openings 182 over conductive layer 174 of interconnect structure 170, an end of bond wire 256 opposite contact pads 252 is bonded to the conductive layer within openings 182. In another embodiment, bond wires 210 are bonded directly to surface 184 of conductive layer 174. Bond wires 256 extend from semiconductor die 240 into openings 182 in encapsulant 156 to interconnect structure 170. Bond wires 256 represent one type of interconnect structure that electrically couples semiconductor die 240 to interconnect structure 170.

In another embodiment, an electrically conductive layer, such as an RDL, is used instead of bond wires 256 to electrically couple semiconductor die 240 to interconnect structure 170. For example, after mounting semiconductor die 240, an electrically conductive layer including one or more layers of Al, Cu, Sn, Ni, Au, Ag, Ti, TiW, W, or other suitable electrically conductive material or combination thereof is formed over semiconductor die 240 using a patterning and metal deposition process such as PVD, CVD, sputtering, electrolytic plating, electroless plating, or screen printing. The conductive layer operates as a backside RDL to redistribute electrical connection from semiconductor die 240 to outside a footprint of semiconductor die 240. The conductive layer is formed over contact pads 252 on active surface 244 of semiconductor die 240, over a side surface of semiconductor die 240, over encapsulant 156 and into openings 182 down to conductive layer 174 in order to electrically connect semiconductor die 240 to interconnect structure 170.

In FIG. 7c, an encapsulant or molding compound 260 is deposited over semiconductor die 124 and 240, bond wire 256, encapsulant 156, and interconnect structure 170 using a paste printing, compressive molding, transfer molding, liquid encapsulant molding, vacuum lamination, spin coating, or other suitable applicator. Encapsulant 260 includes polymer composite material, such as epoxy resin with filler, epoxy acrylate with filler, or polymer with proper filler. Encapsulant 260 is non-conductive and environmentally protects the semiconductor device from external elements and contaminants. Cap 248 protects active region 246 of semiconductor die 240 from encapsulant 260 such that cavity 250 over active region 246 remains devoid of encapsulant 260.

In FIG. 7d, an electrically conductive bump material is deposited over interconnect structure 170 and electrically connected to conductive layer 178 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form spherical balls or bumps 262. In some applications, bumps 262 are reflowed a second time to improve electrical contact to conductive layer 178. The bumps can also be compression bonded to conductive layer 178. Bumps 262 represent one type of interconnect structure that is formed over conductive layer 178. The interconnect structure can also use bond wires, stud bump, micro bump, or other electrical interconnect. Bumps 262 or other interconnect structures are optional, and in one embodiment, are not formed over interconnect structure 170. For example, interconnect structure 170 without bumps 262 operates as an LGA.

Reconstituted panel 154 is singulated with saw blade or laser cutting device 264 through encapsulant 156, encapsulant 260, and interconnect structure 170 into individual semiconductor devices or Fo-eWLB packages 266.

Figure 8:
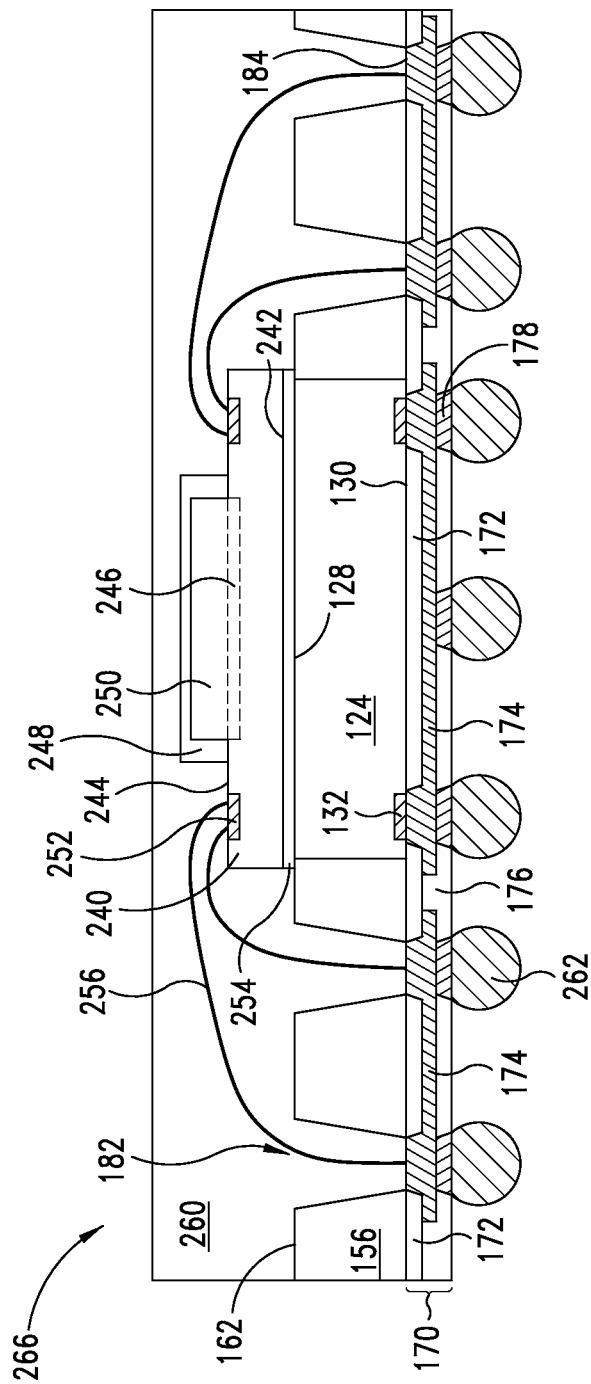
FIG. 8 illustrates a semiconductor package including a MEMS semiconductor die stacked over a Fo-eWLB.

FIG. 8 shows Fo-eWLB package 266 after singulation. Fo-eWLB package 266 includes a wire bonded semiconductor die 240 stacked over a Fo-eWLB. Encapsulant 156 is formed over semiconductor die 124, and back surface 128 of semiconductor die 124 is exposed with respect to encapsulant 156. Interconnect structure 170 is formed over semiconductor die 124 and encapsulant 156 to extend electrical interconnection of semiconductor die 124 to outside a footprint of the die. Interconnect structure 170 includes insulating layers 172 and 176, conductive layers 174 and 178, and may include fewer or additional conductive and insulating layers. Openings 182 in encapsulant 156 provide for wire bonding through encapsulant 156 to interconnect structure 170. Semiconductor die 240 is mounted directly to semiconductor die 124 with die attach adhesive 254. Die attach adhesive 254 allows heat transfer between semiconductor die 124 and semiconductor die 240 to improve the thermal performance of Fo-eWLB package 266. In one embodiment, semiconductor die 124 includes an ASIC and semiconductor die 240 includes a MEMS or other active or passive sensors responsive to various external stimuli. In another embodiment, semiconductor die 124 includes a MEMS and semiconductor die 240 includes an ASIC. Bond wires 256 electrically couple semiconductor die 240 to conductive layer 174 of interconnect structure 170. Encapsulant 260 is deposited over semiconductor die 124 and 240, bond wires 256, encapsulant 156, and interconnect structure 170. Semiconductor die 240 includes active region 246 covered by cap 248 to prevent encapsulant 260 from entering cavity 250 over active region 246. Bumps 262 are optionally formed over conductive layer 178 of interconnect structure 170 prior to singulating reconstituted panel 154 into Fo-eWLB packages 266. Semiconductor die 124 is electrically connected to external devices through interconnect structure 170 and bumps 262. Semiconductor die 240 is electrically connected to semiconductor die 124 and to external devices through bond wires 256, interconnect structure 170, and bumps 262.

Fo-eWLB package 266 with interconnect structure 170 provides a reduced package thickness compared to current semiconductor packages having substrate interposers and a thickness of 0.6-0.7 mm. In one embodiment, a thickness of Fo-eWLB package 266 is within a range of approximately 0.4-0.5 mm. Interconnect structure 170 of Fo-eWLB package 266 includes a thickness of approximately 0.04 mm, while a conventional substrate includes a thickness of approximately 0.13 mm. Thus, a thickness of the bottom interconnect in Fo-eWLB package 266 is reduced by approximately 0.09 mm. In a conventional semiconductor package, the bump height between a flip chip die and substrate contributes approximately 0.05 mm in standoff height. Fo-eWLB package 266 eliminates the need for bumps to be formed between semiconductor die 124 and the bottom interconnect, because interconnect structure 170 is formed directly on semiconductor die 124, thereby further reducing the package height. The design of Fo-eWLB package 266 results in a 15-20% or greater reduction in package thickness. Additionally, Fo-eWLB package 266 is formed using reconstituted panel 154 on standardized carrier 150. Therefore, Fo-eWLB package 266 is manufactured using standardized processing tools, equipment, and bill of materials, thereby reducing the cost to manufacture Fo-eWLB package 266 compared to flip chip hybrid packages.

FIGS. 9a-9c show an alternative method of making a wire bondable Fo-eWLB semiconductor package including a MEMS device. FIG. 9a continues from FIG. 3g and shows a semiconductor die 270 disposed over and mounted to back surface 128 of semiconductor die 124 and to surface 162 of encapsulant 156 using, for example, a pick and place operation with back surface 272 of semiconductor die 270 oriented toward semiconductor die 124. Alternatively, where encapsulant 156 remains covering semiconductor die 124, semiconductor die 270 is mounted to encapsulant 156 over semiconductor die 124.

Each semiconductor die 270 has a back or non-active surface 272 and an active surface 274 containing an active region 276. In one embodiment, active region 276 of semiconductor die 270 includes a MEMS or other active or passive sensors responsive to various external stimuli. An active sensor, such as a photodiode, a phototransistor, or a Hall effect device, generates or controls the flow of electrical current in response to an external stimulus. A passive sensor, such as a photoresistor, thermistor, capacitive accelerometer, or load cell, alters the relationship between voltage and current in response to the external stimulus. The external stimulus can be light, sound, electromagnetic radiation, electric field, magnetic field, ionizing radiation, vibration, motion, acceleration, rotation, orientation, pressure, or temperature. Active region 276 may include piezoelectric and nanoelectronic devices. Active region 276 is electrically connected to other analog and digital circuits on active surface 274 of semiconductor die 270 to perform functions in response to the external stimulus. In another embodiment, active region 276 may contain analog or digital circuits implemented as active devices, passive devices, conductive layers, and dielectric layers formed within the die and electrically interconnected according to the electrical design and function of the die.

Semiconductor die 270 includes an electrically conductive layer 278 formed over active surface 274 using PVD, CVD, electrolytic plating, electroless plating process, or other suitable metal deposition process. Conductive layer 278 includes one or more layers of Al, Cu, Sn, Ni, Au, Ag, or other suitable electrically conductive material or combination thereof. Conductive layer 278 operates as contact pads electrically connected to the circuits on active surface 274. Conductive layer 278 is formed as contact pads disposed side-by-side a first distance from the edge of semiconductor die 270. Alternatively, conductive layer 278 is formed as contact pads that are offset in multiple rows such that a first row of contact pads is disposed a first distance from the edge of the die, and a second row of contact pads alternating with the first row is disposed a second distance from the edge of the die.

A plurality of semiconductor die 270 is mounted to semiconductor die 124 and encapsulant 156 with die attach adhesive or film 280, such as epoxy resin. Semiconductor die 270 is mounted to semiconductor die 124 and encapsulant 156 at the reconstituted wafer-level or panel-level in a chip-on-wafer assembly. Semiconductor die 270 is a KGD having been tested prior to mounting to reconstituted panel 154. In another embodiment, die attach adhesive 280 includes a TIM such as thermal epoxy, thermal epoxy resin, thermal conductive paste, aluminum oxide, zinc oxide, boron nitride, pulverized silver, or thermal grease. Die attach adhesive 280 is cured to secure semiconductor die 270 to semiconductor die 124 and encapsulant 156.

A plurality of bond wires 282 is formed between interconnect structure 170 and contact pads 278 of semiconductor die 270. Prior to wire bonding, reconstituted panel 154 including semiconductor die 270 undergoes an optional cleaning process, such as plasma cleaning or wet cleaning, to remove contamination. Bond wires 282 are mechanically and electrically coupled to conductive layer 174 of interconnect structure 170 and to contact pads 278 of semiconductor die 270 by thermocompression bonding, ultrasonic bonding, wedge bonding, stitch bonding, ball bonding, or other suitable bonding technique. Bond wires 282 include a conductive material such as Cu, Al, Au, Ag, metal alloy, or a combination thereof. Semiconductor die 270 are electrically connected to interconnect structure 170 using bond wires 282. An end of bond wire 282 is bonded to contact pads 278 of semiconductor die 270. In one embodiment, an optional conductive layer is formed within openings 182 over conductive layer 174 of interconnect structure 170, an end of bond wire 256 opposite contact pads 252 is bonded to the conductive layer within openings 182. In another embodiment, bond wires 282 are bonded directly to surface 184 of conductive layer 174. Bond wires 282 extend from semiconductor die 270 into openings 182 in encapsulant 156 to interconnect structure 170. Bond wires 282 represent one type of interconnect structure that electrically couples semiconductor die 270 to interconnect structure 170.

In another embodiment, an electrically conductive layer, such as an RDL, is used instead of bond wires 282 to electrically couple semiconductor die 270 to interconnect structure 170. For example, after mounting semiconductor die 270, an electrically conductive layer including one or more layers of Al, Cu, Sn, Ni, Au, Ag, Ti, TiW, W, or other suitable electrically conductive material or combination thereof is formed over semiconductor die 270 using a patterning and metal deposition process such as PVD, CVD, sputtering, electrolytic plating, electroless plating, or screen printing. The conductive layer operates as a backside RDL to redistribute electrical connection from semiconductor die 270 to outside a footprint of semiconductor die 270. The conductive layer is formed over contact pads 278 on active surface 274 of semiconductor die 270, over a side surface of semiconductor die 270, over encapsulant 156 and into openings 182 down to conductive layer 174 in order to electrically connect semiconductor die 270 to interconnect structure 170.

In FIG. 9b, a protective cover or lid 284 is mounted over semiconductor die 124, semiconductor die 270, and bond wires 282. In one embodiment, lid 284 includes a metal having a low thermal conductivity or another material having low thermal conductivity. In another embodiment, lid 284 includes a sacrificial base material such as silicon, polymer, beryllium oxide, glass, or other suitable low-cost, rigid material. Alternatively, lid 284 operates as a heat spreader and includes Cu, Al, or other material with high thermal conductivity. In yet another embodiment, lid 284 operates as a shielding layer and includes Al, ferrite or carbonyl iron, stainless steel, nickel silver, low-carbon steel, silicon-iron steel, foil, conductive resin, or other metals and composites capable of blocking or absorbing electromagnetic interference (EMI), RF interference, harmonic distortion, and other inter-device interference.

Lid 284 is disposed over the individual semiconductor packages within reconstituted panel 154. Lid 284 is mounted to encapsulant 156 using a suitable attachment or bonding process. In one embodiment, lid 284 is attached to surface 162 of encapsulant 156 using an adhesive material, such as epoxy resin or thermal epoxy. The adhesive material is cured to secure lid 284 to encapsulant 156. In another embodiment, lid 284 is attached to surface 162 of encapsulant 156 using a bump material, such as Al, Sn, Ni, Au, Ag, Pb, Bi, Cu, solder, or combinations thereof. The bump material is reflowed by heating the material above its melting point to form balls or bumps. Lid 284 forms a cavity or relief area 286 over semiconductor die 270, semiconductor die 124, and bond wires 282. In one embodiment, lid 284 includes an opening formed through lid 284 over active region 276 with the position of the opening depending on the design of semiconductor die 270. Lid 284 operates to protect active region 276 of semiconductor die 270 as well as semiconductor die 124 and bond wires 282.

In FIG. 9c, an electrically conductive bump material is deposited over build-up interconnect structure 170 and electrically connected to conductive layer 178 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form spherical balls or bumps 290. In some applications, bumps 290 are reflowed a second time to improve electrical contact to conductive layer 178. The bumps can also be compression bonded to conductive layer 178. Bumps 290 represent one type of interconnect structure that is formed over conductive layer 178. The interconnect structure can also use bond wires, stud bump, micro bump, or other electrical interconnect. Bumps 290 or other interconnect structures are optional, and in one embodiment, are not formed over interconnect structure 170. For example, interconnect structure 170 without bumps 290 operates as an LGA.

Reconstituted panel 154 is singulated with saw blade or laser cutting device 292 through encapsulant 156 and interconnect structure 170 into individual semiconductor devices or Fo-eWLB packages 294.

FIG. 10 shows Fo-eWLB package 294 after singulation. Fo-eWLB package 294 includes a wire bonded semiconductor die 270 stacked over a Fo-eWLB. Encapsulant 156 is formed over semiconductor die 124, and back surface 128 of semiconductor die 124 is exposed with respect to encapsulant 156. Interconnect structure 170 is formed over semiconductor die 124 and encapsulant 156 to extend electrical interconnection of semiconductor die 124 to outside a footprint of the die. Interconnect structure 170 includes insulating layers 172 and 176, conductive layers 174 and 178, and may include fewer or additional conductive and insulating layers. Openings 182 in encapsulant 156 provide for wire bonding through encapsulant 156 to interconnect structure 170. Semiconductor die 270 is mounted directly to semiconductor die 124 with die attach adhesive 280. Die attach adhesive 280 allows heat transfer between semiconductor die 124 and semiconductor die 270 to improve the thermal performance of Fo-eWLB package 294. In one embodiment, semiconductor die 124 includes an ASIC and semiconductor die 270 includes a MEMS or other active or passive sensors responsive to various external stimuli. In another embodiment, semiconductor die 124 includes a MEMS and semiconductor die 270 includes an ASIC. Bond wires 282 electrically couple semiconductor die 270 to conductive layer 174 of interconnect structure 170. Lid 284 is disposed over semiconductor die 124 and 270, bond wires 256, encapsulant 156, and interconnect structure 170. Lid 284 provides relief area 286 to protect active region 276 of semiconductor die 270 and other components of Fo-eWLB package 294. Bumps 290 are optionally formed over conductive layer 178 of interconnect structure 170 prior to singulating reconstituted panel 154 into Fo-eWLB packages 294. Semiconductor die 124 is electrically connected to external devices through interconnect structure 170 and bumps 290. Semiconductor die 270 is electrically connected to semiconductor die 124 and to external devices through bond wires 282, interconnect structure 170, and bumps 290.

Fo-eWLB package 294 with interconnect structure 170 provides a reduced package thickness compared to current semiconductor packages having substrate interposers and a thickness of 0.6-0.7 mm. In one embodiment, a thickness of Fo-eWLB package 294 is within a range of approximately 0.4-0.5 mm. Interconnect structure 170 of Fo-eWLB package 294 includes a thickness of approximately 0.04 mm, while a conventional substrate includes a thickness of approximately 0.13 mm. Thus, a thickness of the bottom interconnect in Fo-eWLB package 294 is reduced by approximately 0.09 mm. In a conventional semiconductor package, the bump height between a flip chip die and substrate contributes approximately 0.05 mm in standoff height. Fo-eWLB package 294 eliminates the need for bumps to be formed between semiconductor die 124 and the bottom interconnect, because interconnect structure 170 is formed directly on semiconductor die 124, thereby further reducing the package height. The design of Fo-eWLB package 294 results in a 15-20% or greater reduction in package thickness. Additionally, Fo-eWLB package 294 is formed using reconstituted panel 154 on standardized carrier 150. Therefore, Fo-eWLB package 294 is manufactured using standardized processing tools, equipment, and bill of materials, thereby reducing the cost to manufacture Fo-eWLB package 294 compared to flip chip hybrid packages.

FIGS. 11a-11b illustrate, in relation to FIG. 1, a method of prefabricating modular interconnect units from a substrate panel. FIG. 11a shows a cross-sectional view of a portion of a substrate panel 300. Substrate panel 300 includes core substrate 302 having opposing surfaces 304 and 306. Core substrate 302 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 302 may include one or more insulating or passivation layers.

A plurality of through vias is formed through core substrate 302 using laser drilling, mechanical drilling, deep reactive ion etching (DRIE), or other suitable process. The through vias extend completely through core substrate 302 from surface 304 to surface 306. The through vias are filled with Al, Cu, Sn, Ni, Au, Ag, Ti, W, or other suitable electrically conductive material or combination thereof using PVD, CVD, electrolytic plating, electroless plating process, or other suitable metal deposition process to form z-direction vertical interconnect structures or conductive vias 308. Alternatively, a conductive layer is formed over the sidewalls of the through vias using PVD, CVD, electrolytic plating, electroless plating process, or other suitable metal deposition process, and a center portion of the through vias is filled with a conductive filler material, e.g., Cu paste, or an insulating filler material, e.g., a polymer plug.

A conductive layer 310 is formed over surface 304 of core substrate 302 and over conductive vias 308 using PVD, CVD, electrolytic plating, electroless plating process, or other suitable metal deposition. Conductive layer 310 includes one or more layers of Al, Cu, Sn, Ni, Au, Ag, or other suitable electrically conductive material or combination thereof. Portions of conductive layer 310 operate as contact pads and are electrically connected to conductive vias 308. Conductive layer 310 also includes portions that are electrically common or electrically isolated depending on the routing design and function of the semiconductor package. In one embodiment, conductive layer 310 operates as an RDL to extend electrical connection from conductive vias 308 to areas adjacent to conductive vias 308 to laterally redistribute electrical signals across substrate panel 300. Conductive layer 310 is formed with traces or pads offset from conductive vias 308. In another embodiment, conductive layer 310 operates as a wire bondable pad or layer for subsequent electrical interconnection to conductive vias 308.

A conductive layer 312 is formed over surface 306 of core substrate 302 and conductive vias 308 using PVD, CVD, electrolytic plating, electroless plating process, or other suitable metal deposition. Conductive layer 312 includes one or more layers of Al, Cu, Sn, Ni, Au, Ag, or other suitable electrically conductive material or combination thereof. Portions of conductive layer 312 operate as contact pads and are electrically connected to conductive vias 308. Conductive layer 312 also may include portions that are electrically common or electrically isolated depending on the routing design and function of the semiconductor package. Alternatively, conductive vias 308 are formed through core substrate 302 after forming conductive layer 310 and conductive layer 312.

Substrate panel 300 is optionally treated by plating or finishing to enhance wire bondable surfaces, such as conductive layer 310, for subsequent wire bonding. An electrically conductive layer 314 may be formed over conductive layer 310 and surface 304 of substrate panel 300 using a patterning and metal deposition process such as printing, PVD, CVD, sputtering, electrolytic plating, and electroless plating. Conductive layer 314 includes one or more layers of Ni, Au, Al, Cu, Sn, Ag, Ti, W, or other suitable electrically conductive material or combination thereof. Conductive layer 314 is formed directly over conductive vias 308 and conductive layer 310. In one embodiment, conductive layer 314 operates as an RDL to extend electrical connection from conductive vias 308 and conductive layer 310 to areas adjacent to conductive vias 308 to laterally redistribute electrical signals across substrate panel 300. Conductive layer 314 is formed with traces or pads offset from conductive vias 308. In another embodiment, conductive layer 314 operates as a wire bondable pad or layer over conductive vias 308 for subsequent electrical interconnection to conductive layer 310 and conductive vias 308.

In FIG. 11b, substrate panel 300 is singulated into individual modular interconnect structures or units 320 using saw blade or laser cutting tool 322. Modular interconnect units 320 are prefabricated from substrate panel 300 and are configured for integration into stacked semiconductor devices. In one embodiment, modular interconnect units 320 are formed without a solder resist layer over surfaces 304 and 306. Modular interconnect units 320 may include additional conductive layers or insulating layers formed over surfaces 304 and 306 to provide additional electrical interconnect across the unit according to the design and functionality of the device. In another embodiment, passive devices are formed over surface 304 or surface 306 of modular interconnect units 320. Conductive layers 310, 312, and 314, as well as additional conductive and insulating layers, may contain passive devices formed within the circuit layers. In another embodiment, a discrete component or passive device is mounted to modular interconnect units 320. Discrete components include filters, discrete passive devices such as inductors, resistors, or capacitors, or other devices.

Figure 12C:
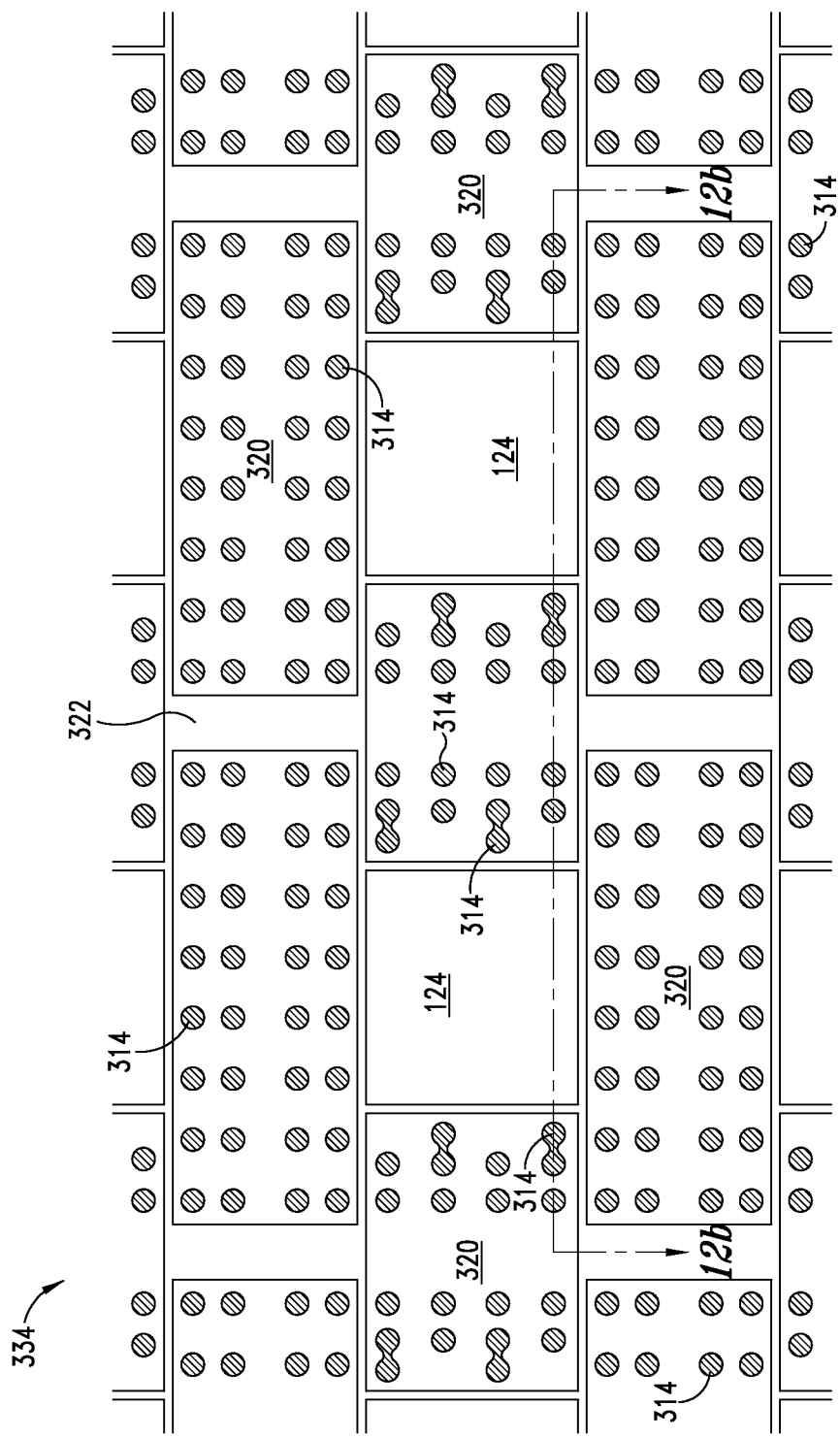

FIGS. 12a-12k illustrate, in relation to FIG. 1, a method of making a wire bondable Fo-eWLB semiconductor package with modular interconnect units. FIG. 12a shows a cross-sectional view of a portion of a carrier or temporary substrate 330 containing sacrificial base material such as silicon, polymer, beryllium oxide, glass, or other suitable low-cost, rigid material for structural support. An interface layer or double-sided tape 332 is formed over carrier 330 as a temporary adhesive bonding film, etch-stop layer, or thermal release layer.

Carrier 330 can be a round or rectangular panel (greater than 300 mm) with capacity for multiple semiconductor die 124. Carrier 330 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment is designed and configured for the size of the wafer or carrier being processed.

To further reduce manufacturing costs, the size of carrier 330 is selected independent of the size of semiconductor die 124 or size of semiconductor wafer 120. That is, carrier 330 has a fixed or standardized size, which can accommodate various size semiconductor die 124 singulated from one or more semiconductor wafers 120. In one embodiment, carrier 330 is circular with a diameter of 330 mm. In another embodiment, carrier 330 is rectangular with a width of 560 mm and length of 600 mm. Semiconductor die 124 may have dimensions of 10 mm by 10 mm, which are placed on the standardized carrier 330. Alternatively, semiconductor die 124 may have dimensions of 20 mm by 20 mm, which are placed on the same standardized carrier 330. Accordingly, standardized carrier 330 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 330 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 12a, semiconductor die 124 from FIG. 2d are mounted to interface layer 332 and over carrier 330 using, for example, a pick and place operation with active surface 130 oriented toward the carrier. FIG. 12a shows semiconductor die 124 mounted to interface layer 332 of carrier 330 as reconstituted panel or reconfigured wafer 334.

Reconstituted wafer or panel 334 can be processed into many types of semiconductor packages, including eWLB, fan-in WLCSP, eWLCSP, fan-out WLCSP, flipchip packages, 3D packages, PoP, or other semiconductor packages. Reconstituted panel 334 is configured according to the specifications of the resulting semiconductor package. In one embodiment, semiconductor die 124 are placed on carrier 330 in a high-density arrangement, i.e., 300 µm apart or less, for processing fan-in devices. The distance between semiconductor die 124 on carrier 330 is optimized for manufacturing the semiconductor packages at the lowest unit cost. The larger surface area of carrier 330 accommodates more semiconductor die 124 and lowers manufacturing cost as more semiconductor die 124 are processed per reconstituted panel 334. The number of semiconductor die 124 mounted to carrier 330 can be greater than the number of semiconductor die 124 singulated from semiconductor wafer 120. Carrier 330 and reconstituted panel 334 provide the flexibility to manufacture many different types of semiconductor packages using different size semiconductor die 124 from different sized semiconductor wafers 120.

In FIG. 12b, modular interconnect units 320 are mounted over carrier 330 adjacent to semiconductor die 124 using, for example, a pick and place operation with an optional adhesive. Modular interconnect units 320 are disposed on interface layer 332 in a peripheral region of semiconductor die 124. Modular interconnect units 320 are disposed within the semiconductor package at specific predetermined locations around semiconductor die 124 to optimize the space within the semiconductor package. When mounting modular interconnect units 320 adjacent to semiconductor die 124, a gap or space may remain between semiconductor die 124 and modular interconnect units 320. Modular interconnect units 320 provide vertical interconnect and increase flexibility of semiconductor package design. Because modular interconnect units 320 are prefabricated, use of modular interconnect units 320 for vertical interconnections reduces the manufacturing steps for the semiconductor package.

FIG. 12c shows a plan view of the semiconductor package from FIG. 12b after mounting semiconductor die 124 and modular interconnect units 320 to interface layer 332 and prior to encapsulating reconstituted panel 334. Modular interconnect units 320 are disposed adjacent to one or more sides of semiconductor die 124. In one embodiment, modular interconnect units 320 are disposed along two, three, or four sides of each semiconductor die 124 on reconstituted panel 334. Modular interconnect units 320 contain multiple rows of conductive vias 308. Conductive layer 314 operates as contact pads or RDLs over conductive vias 308. In another embodiment, without conductive layer 314, conductive layer 310 operates as contact pads or RDLs over conductive vias 308. Modular interconnect units 320 are illustrated in FIG. 12c as including square or rectangular footprints. Alternatively, modular interconnect units 320 include cross-shaped, angled or "L-shaped," or any geometrically-shaped footprint. Any number or configuration of modular interconnect units 320 are disposed adjacent to semiconductor die 124 depending on the routing design and function of the device.

In FIG. 12d, an encapsulant or molding compound 336 is deposited over semiconductor die 124, modular interconnect units 320, and carrier 330 as an insulating material using a paste printing, compressive molding, transfer molding, liquid encapsulant molding, vacuum lamination, spin coating, or other suitable applicator. In particular, encapsulant 336 covers the side surfaces and back surface 128 of semiconductor die 124. Encapsulant 336 covers surface 304 of modular interconnect units 320 and is deposited between semiconductor die 124 and modular interconnect units 320. Encapsulant 336 includes polymer composite material, such as epoxy resin with filler, epoxy acrylate with filler, or polymer with proper filler. Encapsulant 336 is non-conductive and environmentally protects the semiconductor device from external elements and contaminants.

In FIG. 12e, a back surface 338 of encapsulant 336 undergoes an optional backgrinding operation with grinder 340 or other suitable mechanical or etching process to remove a portion of encapsulant 336 and expose back surface 128 of semiconductor die 124. A chemical etch, polishing, or CMP process can also be used to planarize encapsulant 336 and to remove mechanical damage resulting from the grinding operation. The removal of a portion of encapsulant 336 from back surface 338 leaves new back surface 342 of encapsulant 336. Surface 342 of encapsulant 336 is coplanar with back surface 128 of semiconductor die 124. In an alternative embodiment, encapsulant 336 remains covering back surface 128 of semiconductor die 124, for example, where reconstituted panel 334 does not undergo backgrinding. Surface 342 of encapsulant 336 and back surface 128 of semiconductor die 124 may undergo a polishing step to remove damage to base material 122 of semiconductor die 124.

In FIG. 12f, temporary carrier 330 and optional interface layer 332 are removed by chemical etching, mechanical peel-off, CMP, mechanical grinding, thermal bake, laser scanning, or wet stripping. Surface 344 of encapsulant 336 is exposed after carrier 330 and interface layer 332 are removed. Additionally, modular interconnect units 320 and active surface 130 of semiconductor die 124 are exposed after carrier 330 and interface layer 332 are removed.

In FIG. 12g, a build-up interconnect structure 350 is formed over semiconductor die 124 and encapsulant 336. Interconnect structure 350 includes an insulating or passivation layer 352 containing one or more layers of SiO2, Si3N4, SiON, Ta2O5, Al2O3, low temperature curable polymer dielectric resist (i.e., cures at less than 250° C.), BCB, PBO, epoxy based photosensitive polymer dielectric, or other material having similar insulating and structural properties. Insulating layer 352 is formed over active surface 130 of semiconductor die 124, surface 344 of encapsulant 336, and surface 304 of modular interconnect units 320 using PVD, CVD, printing, spin coating, spray coating, sintering or thermal oxidation. A portion of insulating layer 352 is removed by an etching process to expose contact pads 132 of semiconductor die 124 and conductive layer 312 of modular interconnect units 320.

An electrically conductive layer 354 is formed over insulating layer 352, contact pads 132, and conductive layer 312 using a patterning and metal deposition process such as PVD, CVD, sputtering, electrolytic plating, and electroless plating. Conductive layer 354 includes one or more layers of Al, Cu, Ti, TiW, tin Sn, Ni, Au, Ag, W, or other suitable electrically conductive material or combination thereof. Conductive layer 354 operates as an RDL to redistribute electrical connection from semiconductor die 124 to outside a footprint of semiconductor die 124. One portion of conductive layer 354 is electrically connected to contact pads 132 of semiconductor die 124. Other portions of conductive layer 354 are electrically common or electrically isolated depending on the design and function of the semiconductor device.

An insulating or passivation layer 356 is formed over insulating layer 352 and conductive layer 354 using PVD, CVD, printing, spin coating, spray coating, sintering or thermal oxidation. Insulating layer 356 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 356 is removed by an etching process to expose portions of conductive layer 354.

An electrically conductive layer 358 is formed over insulating layer 356 and conductive layer 354 using a patterning and metal deposition process such as PVD, CVD, sputtering, electrolytic plating, and electroless plating. Conductive layer 358 includes one or more layers of Al, Cu, Ti, TiW, tin Sn, Ni, Au, Ag, W, or other suitable electrically conductive material or combination thereof. Conductive layer 358 operates as an RDL or UBM. Conductive layer 358 can be a multi-metal stack with an adhesion layer, a barrier layer, and a seed or wetting layer. One portion of conductive layer 358 is electrically connected to contact pads 132 of semiconductor die 124. Other portions of conductive layer 358 are electrically common or electrically isolated depending on the design and function of the semiconductor device.

Interconnect structure 350 comprises insulating layers 352 and 356 and conductive layers 354 and 358 formed over active surface 130 of semiconductor die 124, surface 344 of encapsulant 336, and surface 306 of modular interconnect units 320. Additional insulating layers and RDLs can be formed over insulating layer 356 and conductive layer 358 to provide additional vertical and horizontal electrical connectivity across the package according to the design and functionality of semiconductor die 124.

In FIG. 12h, a portion of encapsulant 336 is removed by LDA using laser 360 to form openings or vias 362 extending down to conductive layer 314 of modular interconnect units 320. In one embodiment, laser 360 includes a UV laser, CO2 laser, or other suitable laser for LDA. In one embodiment, laser 360 is used in a pulsed laser mode for selective LDA removal of encapsulant 336. Alternatively, openings 362 are formed by an etching process through a patterned photoresist layer, plasma etching, wet etching, high energy water jetting, or other suitable process. Openings 362 are formed adjacent to, in a peripheral region of, and outside a footprint of semiconductor die 124. Openings 362 extend completely through encapsulant 336 from surface 342 of encapsulant 336 to modular interconnect units 320. Openings 362 extend to and expose conductive layer 314 for subsequent electrical interconnection through encapsulant 336. Conductive layers 310 and 314 may include a portion operating as contact pads over conductive vias 308 and a portion operating as RDLs extending beyond a footprint of conductive vias 308. Openings 362 are formed over contact pad portions or RDL portions of conductive layers 310 and 314. In one embodiment, one or more openings 362 are formed directly over conductive vias 308 and extend to surface 364 of conductive layer 314, which operates as contact pads over conductive vias 308. Openings 362 over surface 364 of conductive layer 314 are formed directly over conductive vias 308. In another embodiment, conductive layer 314 is formed as an RDL over conductive layer 310, and conductive layer 314 extends laterally over surface 304 of modular interconnect units 320. One or more openings 362 are formed outside a footprint of conductive vias 308 and extend through encapsulant 336 to surface 366 of conductive layer 314, which operates as an RDL portion of conductive layer 314. Openings 362 over surface 366 of conductive layer 314 are formed offset from conductive vias 308. In yet another embodiment, without conductive layer 314, openings 362 extend to and expose conductive layer 310 for subsequent electrical interconnection through encapsulant 336.

Openings 362 have a footprint or cross-sectional area that is circular, oval, square, rectangular, or any other geometric shape. In one embodiment, openings 362 include sloped sidewalls forming a tapered shape with a larger diameter at the top of opening 362 and a smaller diameter at the bottom of opening 362. In another embodiment, openings 362 include vertical sidewalls. Openings 362 provide for subsequent electrical interconnect to modular interconnect units 320 for vertical interconnection to stacked semiconductor die.

In FIG. 12i, a plurality of semiconductor die 370 is disposed over and mounted to back surface 128 of semiconductor die 124 and surface 342 of encapsulant 336 using, for example, a pick and place operation with back surface 372 of semiconductor die 370 oriented toward semiconductor die 124. Each semiconductor die 370 has a back or non-active surface 372 and an active surface 374 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 374 to implement analog circuits or digital circuits, such as DSP, ASIC, MEMS, memory, or other signal processing circuit. In one embodiment, active surface 374 contains a MEMS, such as an accelerometer, gyroscope, strain gauge, microphone, or other sensor responsive to various external stimuli. Semiconductor die 370 may also contain IPDs, such as inductors, capacitors, and resistors, for RF signal processing.

Semiconductor die 370 includes an electrically conductive layer 376 formed over active surface 374 using PVD, CVD, electrolytic plating, electroless plating process, or other suitable metal deposition process. Conductive layer 376 includes one or more layers of Al, Cu, Sn, Ni, Au, Ag, or other suitable electrically conductive material or combination thereof. Conductive layer 376 operates as contact pads electrically connected to the circuits on active surface 374. Conductive layer 376 is formed as contact pads disposed side-by-side a first distance from the edge of semiconductor die 370. Alternatively, conductive layer 376 is formed as contact pads that are offset in multiple rows such that a first row of contact pads is disposed a first distance from the edge of the die, and a second row of contact pads alternating with the first row is disposed a second distance from the edge of the die.

Semiconductor die 370 are mounted to semiconductor die 124 and encapsulant 336 with die attach adhesive or film 378, such as epoxy resin. Semiconductor die 370 is mounted to semiconductor die 124 and encapsulant 336 at the reconstituted wafer-level or panel-level in a chip-on-wafer assembly. Semiconductor die 370 is a KGD having been tested prior to mounting to reconstituted panel 334. In another embodiment, die attach adhesive 378 includes a TIM such as thermal epoxy, thermal epoxy resin, thermal conductive paste, aluminum oxide, zinc oxide, boron nitride, pulverized silver, or thermal grease. Die attach adhesive 378 is cured to secure semiconductor die 370 to semiconductor die 124 and encapsulant 336.

A plurality of bond wires 380a-380b is formed between modular interconnect units 320 and contact pads 376 of semiconductor die 370. Prior to wire bonding, reconstituted panel 334 including semiconductor die 370 undergoes an optional cleaning process, such as plasma cleaning or wet cleaning, to remove contamination. Bond wires 380a-380b are mechanically and electrically coupled to conductive layer 310 or 314 of modular interconnect units 320 and to contact pads 376 of semiconductor die 370 by thermocompression bonding, ultrasonic bonding, wedge bonding, stitch bonding, ball bonding, or other suitable bonding technique. Bond wires 380a-380b operate as interconnect structures to electrically couple semiconductor die 370 to modular interconnect units 320. Bond wires 380a-380b include a conductive material such as Cu, Al, Au, Ag, metal alloy, or a combination thereof. Semiconductor die 370 are electrically connected to modular interconnect units 320 using bond wires 380a-380b. Bond wires 380a-380b extend from semiconductor die 370 into openings 362 in encapsulant 336 to modular interconnect units 320. Bond wires 380a are attached to surface 364, a contact pad portion, of conductive layer 314 and to contact pads 376 of semiconductor die 370. Bond wires 380b are attached to surface 366, an RDL portion, of conductive layer 314 and to contact pads 376 of semiconductor die 370. Conductive layers 310 and 314 include an RDL portion that routes conductive layers 310 and 314 across modular interconnect units 320 to optimize the interconnect layout and shorten the length of the bond wires. Openings 362 over surface 366 of conductive layer 314 are closer to semiconductor die 370 than openings over surface 364 of conductive layer 314. Therefore, bond wires 380b coupled to surface 366 of conductive layer 314 have a reduced length compared to bond wires 380a. The shorter length of bond wires 380b improves the electrical performance of the semiconductor device. Bond wires 380a-380b represent one type of interconnect structure that electrically couples semiconductor die 370 to modular interconnect units 320.

In another embodiment, an electrically conductive layer, such as an RDL, is used instead of bond wires 380a-380b to electrically couple semiconductor die 370 to modular interconnect units 320. For example, after mounting semiconductor die 370, an electrically conductive layer including one or more layers of Al, Cu, Sn, Ni, Au, Ag, Ti, TiW, W, or other suitable electrically conductive material or combination thereof is formed over semiconductor die 370 using a patterning and metal deposition process such as PVD, CVD, sputtering, electrolytic plating, electroless plating, or screen printing. The conductive layer operates as a backside RDL to redistribute electrical connection from semiconductor die 370 to outside a footprint of semiconductor die 370. The conductive layer is formed over contact pads 376 on active surface 374 of semiconductor die 370, over a side surface of semiconductor die 370, over encapsulant 336 and into openings 362 down to conductive layer 314 in order to electrically connect semiconductor die 370 to modular interconnect units 320.

Figure 12J:
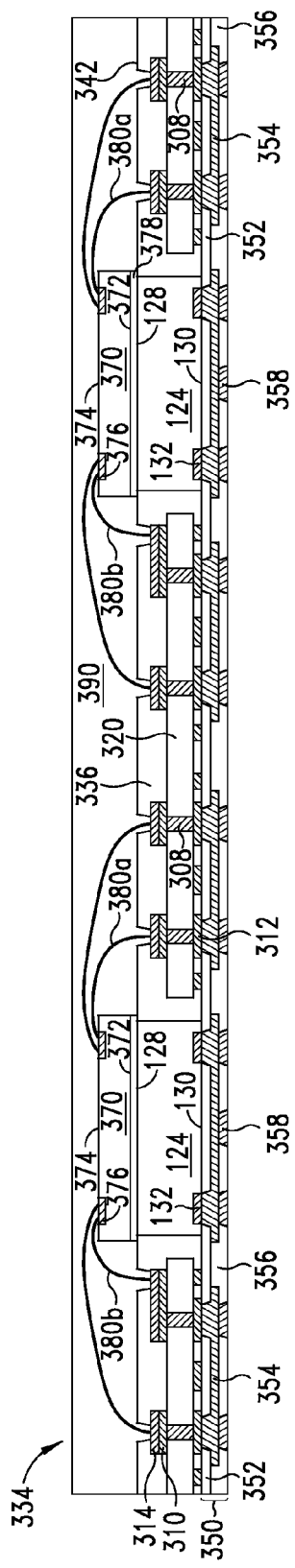

In FIG. 12j, an encapsulant or molding compound 390 is deposited over semiconductor die 124 and 370, bond wires 380a-380b, encapsulant 336, and modular interconnect units 320 using a paste printing, compressive molding, transfer molding, liquid encapsulant molding, vacuum lamination, spin coating, or other suitable applicator. Encapsulant 390 includes polymer composite material, such as epoxy resin with filler, epoxy acrylate with filler, or polymer with proper filler. Encapsulant 390 is non-conductive and environmentally protects the semiconductor device from external elements and contaminants. Prior to depositing encapsulant 390, a discrete component or passive device may be mounted to modular interconnect units 320. Discrete components include filters, discrete passive devices such as inductors, resistors, or capacitors, or other devices.

Figure 12K:
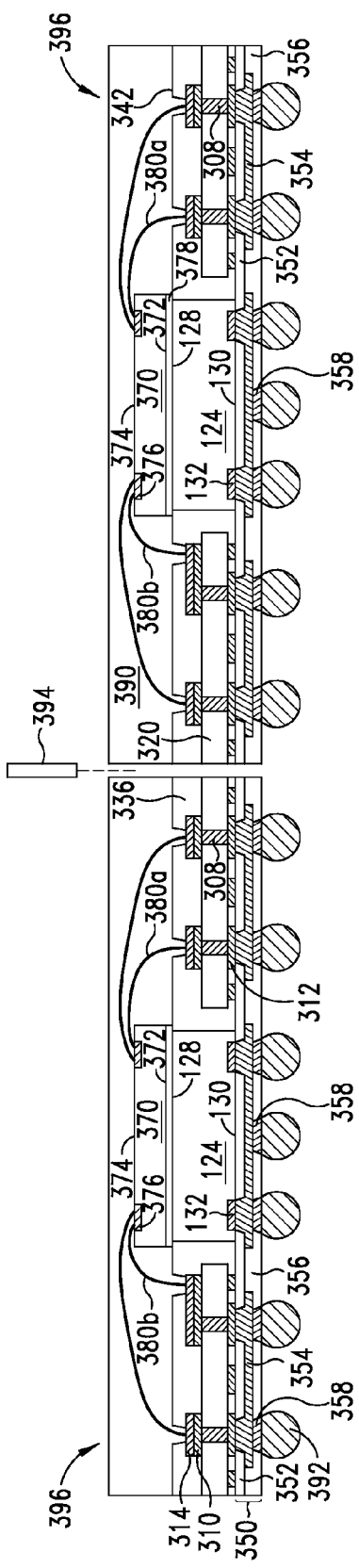

In FIG. 12k, an electrically conductive bump material is deposited over interconnect structure 350 and electrically connected to conductive layer 358 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 358 using a suitable attachment or bonding process. In one embodiment, the bump material is reflowed by heating the material above its melting point to form spherical balls or bumps 392. In some applications, bumps 392 are reflowed a second time to improve electrical contact to conductive layer 358. The bumps can also be compression bonded to conductive layer 358. Bumps 392 represent one type of interconnect structure that is formed over conductive layer 358. The interconnect structure can also use bond wires, stud bump, micro bump, or other electrical interconnect. Bumps 392 or other interconnect structures are optional, and in one embodiment, are not formed over interconnect structure 350. For example, interconnect structure 350 without bumps 392 operates as an LGA.

Reconstituted panel 334 is singulated with saw blade or laser cutting device 394 through encapsulant 336, encapsulant 390, modular interconnect units 320, and interconnect structure 350 into individual semiconductor devices or Fo-eWLB packages 396.

Figure 13:
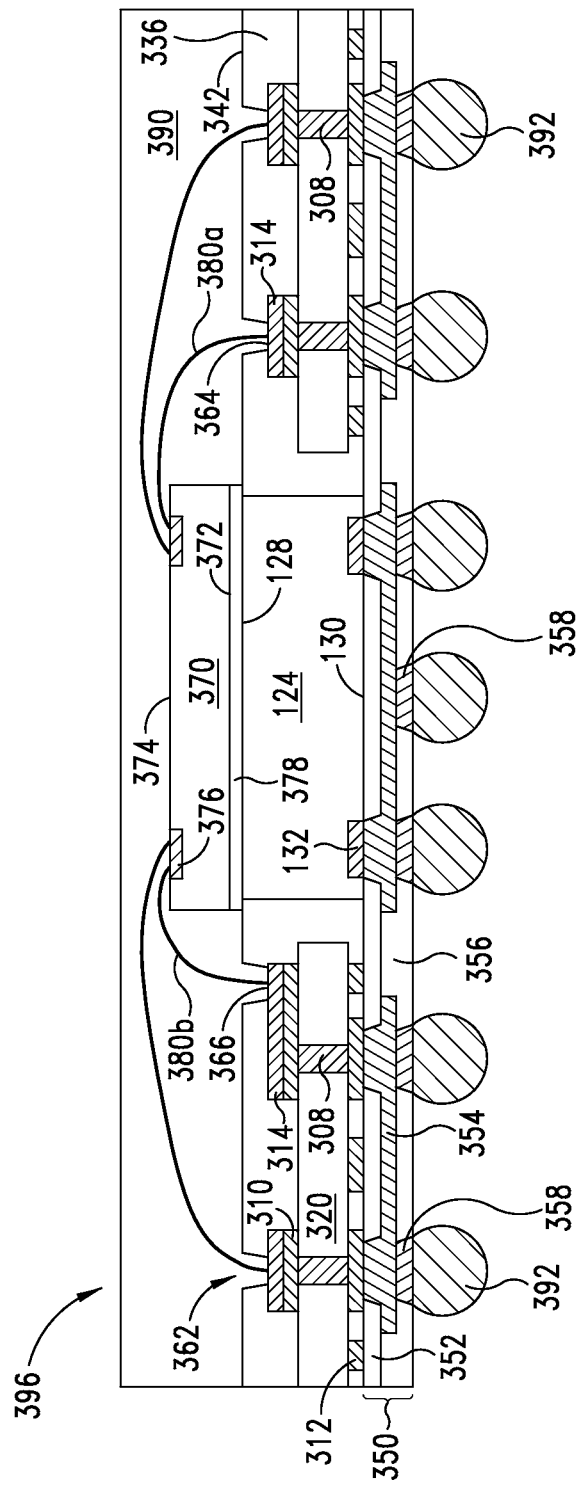
FIG. 13 illustrates a semiconductor package including a wire bonded semiconductor die stacked over a Fo-eWLB with modular interconnect units.

FIG. 13 shows Fo-eWLB package 396 after singulation. Fo-eWLB package 396 includes a wire bonded semiconductor die 370 stacked over a Fo-eWLB. Encapsulant 336 is formed over semiconductor die 124 and modular interconnect units 320. A portion of encapsulant 336 is removed to form a thinner package and expose back surface 128 of semiconductor die 124 with respect to encapsulant 336. Interconnect structure 350 is formed over semiconductor die 124, modular interconnect units 320, and encapsulant 336 to extend electrical interconnection of semiconductor die 124 to outside a footprint of the die. Interconnect structure 350 includes insulating layers 352 and 356, conductive layers 354 and 358, and may include fewer or additional conductive and insulating layers. Openings 362 in encapsulant 336 provide for wire bonding through encapsulant 336 to modular interconnect units 320. Semiconductor die 370 is mounted directly to semiconductor die 124 with die attach adhesive 378. Die attach adhesive 378 allows heat transfer between semiconductor die 124 and semiconductor die 370 to improve the thermal performance of Fo-eWLB package 396. In one embodiment, semiconductor die 124 includes an application or baseband mobile processor and semiconductor die 370 includes a memory device. In another embodiment, semiconductor die 124 includes a memory device and semiconductor die 370 includes an application or baseband mobile processor. Bond wires 380a-380b electrically couple semiconductor die 370 to conductive layer 310 or 314 of modular interconnect units 320. In another embodiment, without optional conductive layer 314, bond wires 380a-380b or another interconnect structure couples semiconductor die 370 directly to conductive layer 310 of modular interconnect units 320. Encapsulant 390 is deposited over semiconductor die 124 and 370, bond wires 380a-380b, encapsulant 336, and modular interconnect units 320. Bumps 392 are optionally formed over conductive layer 358 of interconnect structure 350 prior to singulating reconstituted panel 334 into Fo-eWLB packages 396. Semiconductor die 124 is electrically connected to external devices through interconnect structure 350 and bumps 392. Semiconductor die 370 is electrically connected to semiconductor die 124 and to external devices through bond wires 380a-380b, modular interconnect units 320, interconnect structure 350, and bumps 392.

Modular interconnect units 320 are prefabricated and provide a cost effective alternative for vertical interconnection in Fo-eWLB package 396. Modular interconnect units 320 are manufactured with lower cost materials and manufacturing technology. Use of modular interconnect units 320 for vertical interconnection decreases cycle time and increases manufacturing throughput. Modular interconnect units 320 also provide improved control of vertical interconnection. Openings 362 are formed directly over contact pads over conductive vias 308 or are formed over RDL portions of conductive layer 314 offset from conductive vias 308. Thus, modular interconnect units 320 increase the design flexibility of Fo-eWLB package 396. Openings 362 formed offset from conductive vias 308 reduce the length of bond wires 380b that connect semiconductor die 370 to modular interconnect units 320. Shorter bond wires 380b improve the electrical characteristics of Fo-eWLB packages 396. Therefore, modular interconnect units 320 improve the electrical performance and functionality of Fo-eWLB package 396, while decreasing cost and without increasing package thickness.

Fo-eWLB package 396 with interconnect structure 350 provides a reduced package thickness compared to current semiconductor packages having substrate interposers and a thickness of 0.6-0.7 mm. In one embodiment, a thickness of Fo-eWLB package 396 is within a range of approximately 0.4-0.5 mm. Interconnect structure 350 of Fo-eWLB package 396 includes a thickness of approximately 0.04 mm, while a conventional substrate includes a thickness of approximately 0.13 mm. Modular interconnect units 320 provide electrical routing and can reduce the amount of additional RDL formed over the front side and backside of Fo-eWLB package 396. Thus, a thickness of the bottom interconnect in Fo-eWLB package 396 is reduced by approximately 0.09 mm or more. In a conventional semiconductor package, the bump height between a flip chip die and substrate contributes approximately 0.05 mm in standoff height. Fo-eWLB package 396 eliminates the need for bumps to be formed between semiconductor die 124 and the bottom interconnect, because interconnect structure 350 is formed directly on semiconductor die 124, thereby further reducing the package height. The design of Fo-eWLB package 396 results in a 15-20% or greater reduction in package thickness. Additionally, Fo-eWLB package 396 is formed using reconstituted panel 334 on standardized carrier 330. Therefore, Fo-eWLB package 396 is manufactured using standardized processing tools, equipment, and bill of materials, thereby reducing the cost to manufacture Fo-eWLB package 396 compared to flip chip hybrid packages.

Figure 14:
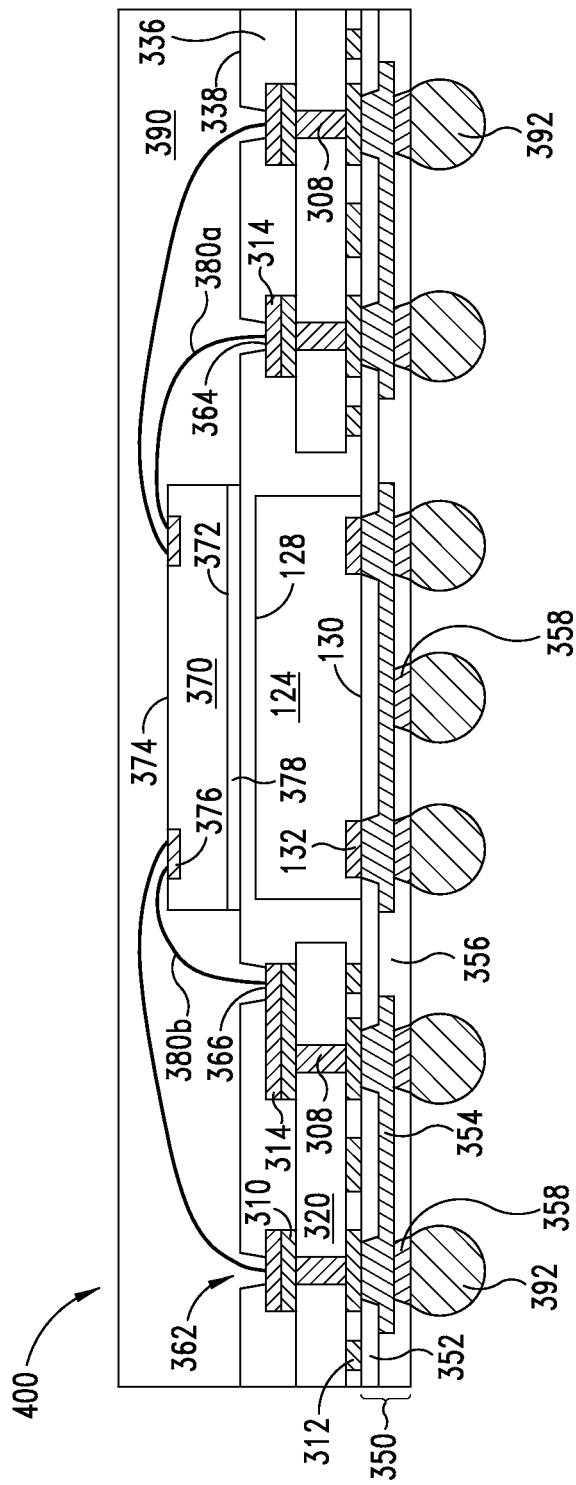
FIG. 14 illustrates another semiconductor package including a wire bonded semiconductor die mounted to encapsulant of a Fo-eWLB with modular interconnect units.

FIG. 14 shows a Fo-eWLB package 400 formed by a process similar to the process of forming Fo-eWLB package 396. Fo-eWLB package 400 includes a wire bonded semiconductor die 370 stacked over encapsulant 336 of a Fo-eWLB. Encapsulant 336 is formed over and around semiconductor die 124 and modular interconnect units 320. To reduce the cost of Fo-eWLB package 400, the optional backgrinding step is eliminated and encapsulant 336 remains covering semiconductor die 124. Interconnect structure 350 is formed over semiconductor die 124 and encapsulant 336 to extend electrical interconnection of semiconductor die 124 to outside a footprint of the die. Interconnect structure 350 includes insulating layers 352 and 356, conductive layers 354 and 358, and may include fewer or additional conductive and insulating layers. Openings 362 in encapsulant 336 provide for wire bonding through encapsulant 336 to modular interconnect units 320. Semiconductor die 370 is disposed over and mounted to back surface 338 of encapsulant 336 with die attach adhesive 378. In one embodiment, semiconductor die 124 includes an application or baseband mobile processor and semiconductor die 370 includes a memory device. In another embodiment, semiconductor die 124 includes a memory device and semiconductor die 200 includes an application or baseband mobile processor. Bond wires 380a-380b electrically couple semiconductor die 370 to conductive layer 310 or 314 of modular interconnect units 320. In another embodiment, without optional conductive layer 314, bond wires 380a-380b or another interconnect structure couples semiconductor die 370 directly to conductive layer 310 of modular interconnect units 320. Encapsulant 390 is deposited over semiconductor die 124 and 370, bond wires 380a-380b, encapsulant 336, and modular interconnect units 320. Bumps 392 are optionally formed over conductive layer 358 of interconnect structure 350 prior to singulating reconstituted panel 334 into Fo-eWLB packages 400. Semiconductor die 124 is electrically connected to external devices through interconnect structure 350 and bumps 392. Semiconductor die 370 is electrically connected to semiconductor die 124 and to external devices through bond wires 380a-380b, modular interconnect units 320, interconnect structure 350, and bumps 392.

Modular interconnect units 320 are prefabricated and provide a cost effective alternative for vertical interconnection in Fo-eWLB package 400. Modular interconnect units 320 are manufactured with lower cost materials and manufacturing technology. Use of modular interconnect units 320 for vertical interconnection decreases cycle time and increases manufacturing throughput. Modular interconnect units 320 also provide improved control of vertical interconnection. Openings 362 are formed directly over contact pads over conductive vias 308 or are formed over RDL portions of conductive layer 314 offset from conductive vias 308. Thus, modular interconnect units 320 increase the design flexibility of Fo-eWLB package 400. Openings 362 formed offset from conductive vias 308 reduces the length of bond wires 380b that connect semiconductor die 370 to modular interconnect units 320. Shorter bond wires 380b improve the electrical characteristics of Fo-eWLB packages 400. Therefore, modular interconnect units 320 improve the electrical performance and functionality of Fo-eWLB package 400, while decreasing cost and without increasing package thickness.

Fo-eWLB package 400 with interconnect structure 350 provides a reduced package thickness compared to current semiconductor packages having substrate interposers and a thickness of 0.6-0.7 mm. In one embodiment, a thickness of Fo-eWLB package 400 is less than approximately 0.6 mm. Interconnect structure 350 of Fo-eWLB package 400 includes a thickness of approximately 0.04 mm, while a conventional substrate includes a thickness of approximately 0.13 mm. Modular interconnect units 320 provide electrical routing and can reduce the amount of additional RDL formed over the front side and backside of Fo-eWLB package 400. Thus, a thickness of the bottom interconnect in Fo-eWLB package 400 is reduced by approximately 0.09 mm or more. In a conventional semiconductor package, the bump height between a flip chip die and substrate contributes approximately 0.05 mm in standoff height. Fo-eWLB package 400 eliminates the need for bumps to be formed between semiconductor die 124 and the bottom interconnect, because interconnect structure 350 is formed directly on semiconductor die 124, thereby further reducing the package height. The design of Fo-eWLB package 400 results in a 15-20% or greater reduction in package thickness. Fo-eWLB package 400 is manufactured at a lower cost by removing the step of backgrinding encapsulant 336. Additionally, Fo-eWLB package 400 is formed using reconstituted panel 334 on standardized carrier 330. Therefore, Fo-eWLB package 400 is manufactured using standardized processing tools, equipment, and bill of materials, thereby reducing the cost to manufacture Fo-eWLB package 400 compared to flip chip hybrid packages.

Figure 15:
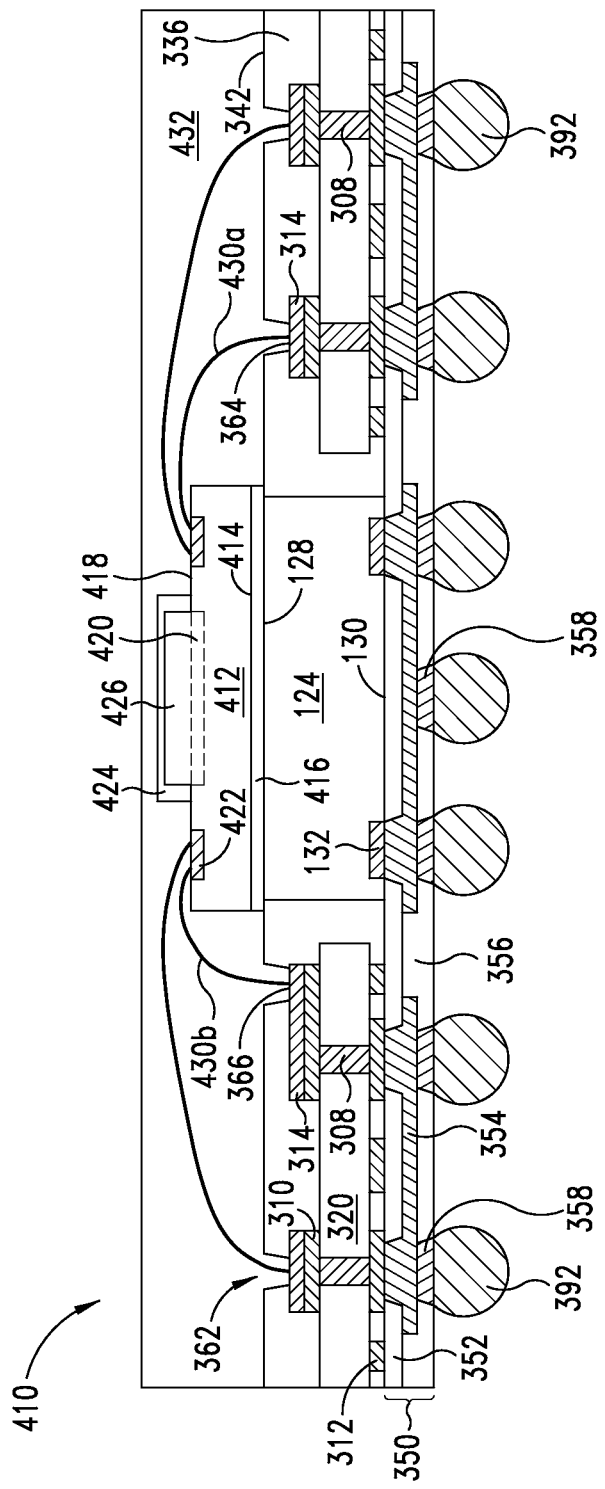
FIG. 15 illustrates a semiconductor package including a MEMS semiconductor die stacked over a Fo-eWLB with modular interconnect units.

FIG. 15 shows a Fo-eWLB package 410 including a MEMs semiconductor die stacked over a Fo-eWLB with modular interconnect units. Encapsulant 336 is formed over semiconductor die 124 and modular interconnect units 320. A portion of encapsulant 336 is removed to form a thinner package and expose back surface 128 of semiconductor die 124 with respect to encapsulant 336. Interconnect structure 350 is formed over semiconductor die 124, modular interconnect units 320, and encapsulant 336 to extend electrical interconnection of semiconductor die 124 to outside a footprint of the die. Interconnect structure 350 includes insulating layers 352 and 356, conductive layers 354 and 358, and may include fewer or additional conductive and insulating layers. Openings 362 in encapsulant 336 provide for wire bonding through encapsulant 336 to modular interconnect units 320. Semiconductor die 412 is mounted with a back surface 414 oriented toward back surface 128 of semiconductor die 124 and surface 342 of encapsulant 336 with die attach adhesive 416. Semiconductor die 412 includes active surface 418 containing an active region 420. In one embodiment, semiconductor die 124 includes an ASIC and semiconductor die 412 includes a MEMS or other active or passive sensors responsive to various external stimuli. In another embodiment, semiconductor die 124 includes a MEMS and semiconductor die 412 includes an ASIC. Semiconductor die 412 includes an electrically conductive layer 422 formed over active surface 418. Conductive layer 422 operates as contact pads electrically connected to the circuits on active surface 418. A cover or cap 424 is disposed over active region 420 of semiconductor die 412. Cap 424 completely covers active region 420 and is attached to active surface 418 with a sealing material to form a cavity 426 over active region 420. Cavity 426 operates as a sealed area directly over active region 420 to protect active region 420.

Bond wires or interconnect structures 430a-430b electrically couple semiconductor die 412 to modular interconnect units 320. Bond wires 430a-430b are mechanically and electrically coupled to conductive layer 310 or 314 of modular interconnect units 320 and to contact pads 422 of semiconductor die 412 by thermocompression bonding, ultrasonic bonding, wedge bonding, stitch bonding, ball bonding, or other suitable bonding technique. Bond wires 430a-430b extend from semiconductor die 412 into openings 362 in encapsulant 336 to modular interconnect units 320. Bond wires 430a are attached to surface 364, a contact pad portion, of conductive layer 314 and to contact pads 422 of semiconductor die 412. Bond wires 430b are attached to surface 366, an RDL portion, of conductive layer 314 and to contact pads 422 of semiconductor die 412. In another embodiment, a conductive layer or RDL is formed over contact pads 422 of semiconductor die 412, over a side surface of semiconductor die 412, over encapsulant 336 and into openings 362 down to surfaces 364 and 366 of conductive layer 314 in order to electrically connect semiconductor die 412 to modular interconnect units 320. In another embodiment, without optional conductive layer 314, bond wires 430a-430b or another interconnect structure couples semiconductor die 412 directly to conductive layer 310 of modular interconnect units 320.

Encapsulant 432 is deposited over semiconductor die 124 and 412, bond wires 430a-430b, encapsulant 336, and modular interconnect units 320. Cap 424 protects active region 420 of semiconductor die 412 from encapsulant 432 such that cavity 426 over active region 420 remains devoid of encapsulant 432. Bumps 392 are optionally formed over conductive layer 358 of interconnect structure 350 prior to singulating reconstituted panel 334 into Fo-eWLB packages 410. Semiconductor die 124 is electrically connected to external devices through interconnect structure 350 and bumps 392. Semiconductor die 412 is electrically connected to semiconductor die 124 and to external devices through bond wires 430a-430b, modular interconnect units 320, interconnect structure 350, and bumps 392.

Modular interconnect units 320 are prefabricated and provide a cost effective alternative for vertical interconnection in Fo-eWLB package 410. Modular interconnect units 320 are manufactured with lower cost materials and manufacturing technology. Use of modular interconnect units 320 for vertical interconnection decreases cycle time and increases manufacturing throughput. Modular interconnect units 320 also provide improved control of vertical interconnection. Openings 362 are formed directly over contact pads over conductive vias 308 or are formed over RDL portions of conductive layer 314 offset from conductive vias 308. Thus, modular interconnect units 320 increase the design flexibility of Fo-eWLB package 410. Openings 362 formed offset from conductive vias 308 reduce the length of bond wires 430b that connect semiconductor die 412 to modular interconnect units 320. Shorter bond wires 430b improve the electrical characteristics of Fo-eWLB packages 410. Therefore, modular interconnect units 320 improve the electrical performance and functionality of Fo-eWLB package 410, while decreasing cost and without increasing package thickness.

Fo-eWLB package 410 with interconnect structure 350 provides a reduced package thickness compared to current semiconductor packages having substrate interposers and a thickness of 0.6-0.7 mm. In one embodiment, a thickness of Fo-eWLB package 410 is within a range of approximately 0.4-0.5 mm. Interconnect structure 350 of Fo-eWLB package 410 includes a thickness of approximately 0.04 mm, while a conventional substrate includes a thickness of approximately 0.13 mm. Modular interconnect units 320 provide electrical routing and can reduce the amount of additional RDL formed over the front side and backside of Fo-eWLB package 410. Thus, a thickness of the bottom interconnect in Fo-eWLB package 410 is reduced by approximately 0.09 mm or more. In a conventional semiconductor package, the bump height between a flip chip die and substrate contributes approximately 0.05 mm in standoff height. Fo-eWLB package 410 eliminates the need for bumps to be formed between semiconductor die 124 and the bottom interconnect, because interconnect structure 350 is formed directly on semiconductor die 124, thereby further reducing the package height. The design of Fo-eWLB package 410 results in a 15-20% or greater reduction in package thickness. Additionally, Fo-eWLB package 410 is formed using reconstituted panel 334 on standardized carrier 330. Therefore, Fo-eWLB package 410 is manufactured using standardized processing tools, equipment, and bill of materials, thereby reducing the cost to manufacture Fo-eWLB package 410 compared to flip chip hybrid packages.

Figure 16:
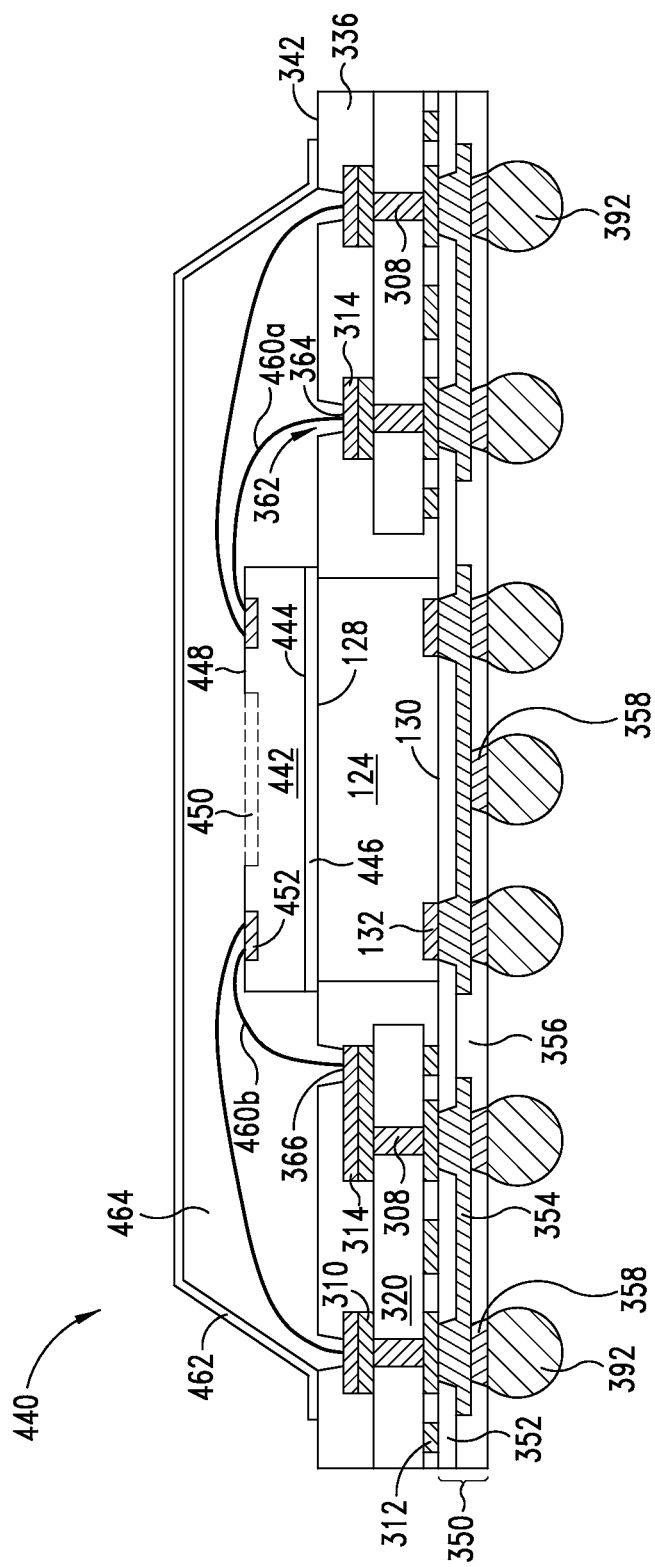
FIG. 16 illustrates another semiconductor package including a MEMS semiconductor die stacked over a Fo-eWLB with modular interconnect units.

FIG. 16 shows a Fo-eWLB package 440 including a MEMs semiconductor die stacked over a Fo-eWLB with modular interconnect units. Encapsulant 336 is formed over semiconductor die 124 and modular interconnect units 320. A portion of encapsulant 336 is removed to form a thinner package and expose back surface 128 of semiconductor die 124 with respect to encapsulant 336. Interconnect structure 350 is formed over semiconductor die 124, modular interconnect units 320, and encapsulant 336 to extend electrical interconnection of semiconductor die 124 to outside a footprint of the die. Interconnect structure 350 includes insulating layers 352 and 356, conductive layers 354 and 358, and may include fewer or additional conductive and insulating layers. Openings 362 in encapsulant 336 provide for wire bonding through encapsulant 336 to modular interconnect units 320. Semiconductor die 442 is mounted with a back surface 444 oriented toward back surface 128 of semiconductor die 124 and surface 342 of encapsulant 336 with die attach adhesive 446. Semiconductor die 442 includes active surface 448 containing an active region 450. In one embodiment, semiconductor die 124 includes an ASIC and semiconductor die 442 includes a MEMS or other active or passive sensors responsive to various external stimuli. In another embodiment, semiconductor die 124 includes a MEMS and semiconductor die 442 includes an ASIC. Semiconductor die 442 includes an electrically conductive layer 452 formed over active surface 448. Conductive layer 452 operates as contact pads electrically connected to the circuits on active surface 448.

Bond wires or interconnect structures 460a-460b electrically couple semiconductor die 442 to modular interconnect units 320. Bond wires 460a-460b are mechanically and electrically coupled to conductive layer 310 or 314 of modular interconnect units 320 and to contact pads 452 of semiconductor die 442 by thermocompression bonding, ultrasonic bonding, wedge bonding, stitch bonding, ball bonding, or other suitable bonding technique. Bond wires 460a-460b extend from semiconductor die 442 into openings 362 in encapsulant 336 to modular interconnect units 320. Bond wires 460a are attached to surface 364, a contact pad portion, of conductive layer 314 and to contact pads 452 of semiconductor die 442. Bond wires 460b are attached to surface 366, an RDL portion, of conductive layer 314 and to contact pads 452 of semiconductor die 442. In another embodiment, a conductive layer or RDL is formed over contact pads 452 of semiconductor die 442, over a side surface of semiconductor die 442, over encapsulant 336 and into openings 362 down to surfaces 364 and 366 of conductive layer 314 in order to electrically connect semiconductor die 442 to modular interconnect units 320. In another embodiment, without optional conductive layer 314, bond wires 460a-460b or another interconnect structure couples semiconductor die 442 directly to conductive layer 310 of modular interconnect units 320.

A protective cover or lid 462 is mounted over semiconductor die 124 and 442, bond wires 460a-460b, encapsulant 336, and modular interconnect units 320. Lid 462 may include an opening over active region 450, depending on the design of semiconductor die 442. Lid 462 is mounted to encapsulant 336 using a suitable attachment or bonding process. Lid 462 forms a cavity or relief area 464 over semiconductor die 442, semiconductor die 124, and bond wires 460a-460b. Lid 462 operates to protect active region 450 of semiconductor die 442 as well as semiconductor die 124 and bond wires 460a-460b. Bumps 392 are optionally formed over conductive layer 358 of interconnect structure 350 prior to singulating reconstituted panel 334 into Fo-eWLB packages 440. Semiconductor die 124 is electrically connected to external devices through interconnect structure 350 and bumps 392. Semiconductor die 442 is electrically connected to semiconductor die 124 and to external devices through bond wires 460a-460b, modular interconnect units 320, interconnect structure 350, and bumps 392.

Modular interconnect units 320 are prefabricated and provide a cost effective alternative for vertical interconnection in Fo-eWLB package 440. Modular interconnect units 320 are manufactured with lower cost materials and manufacturing technology. Use of modular interconnect units 320 for vertical interconnection decreases cycle time and increases manufacturing throughput. Modular interconnect units 320 also provide improved control of vertical interconnection. Openings 362 are formed directly over contact pads over conductive vias 308 or are formed over RDL portions of conductive layer 314 offset from conductive vias 308. Thus, modular interconnect units 320 increase the design flexibility of Fo-eWLB package 440. Openings 362 formed offset from conductive vias 308 reduces the length of bond wires 460b that connect semiconductor die 442 to modular interconnect units 320. Shorter bond wires 460b improve the electrical characteristics of Fo-eWLB packages 440. Therefore, modular interconnect units 320 improve the electrical performance and functionality of Fo-eWLB package 440, while decreasing cost and without increasing package thickness.

Fo-eWLB package 440 with interconnect structure 350 provides a reduced package thickness compared to current semiconductor packages having substrate interposers and a thickness of 0.6-0.7 mm. In one embodiment, a thickness of Fo-eWLB package 440 is within a range of approximately 0.4-0.5 mm. Interconnect structure 350 of Fo-eWLB package 440 includes a thickness of approximately 0.04 mm, while a conventional substrate includes a thickness of approximately 0.13 mm. Modular interconnect units 320 provide electrical routing and can reduce the amount of additional RDL formed over the front side and backside of Fo-eWLB package 440. Thus, a thickness of the bottom interconnect in Fo-eWLB package 440 is reduced by approximately 0.09 mm or more. In a conventional semiconductor package, the bump height between a flip chip die and substrate contributes approximately 0.05 mm in standoff height. Fo-eWLB package 440 eliminates the need for bumps to be formed between semiconductor die 124 and the bottom interconnect, because interconnect structure 350 is formed directly on semiconductor die 124, thereby further reducing the package height. The design of Fo-eWLB package 440 results in a 15-20% or greater reduction in package thickness. Additionally, Fo-eWLB package 440 is formed using reconstituted panel 334 on standardized carrier 330. Therefore, Fo-eWLB package 440 is manufactured using standardized processing tools, equipment, and bill of materials, thereby reducing the cost to manufacture Fo-eWLB package 440 compared to flip chip hybrid packages.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die;
   depositing a first encapsulant over the first semiconductor die;
   forming an interconnect structure over the first semiconductor die and first encapsulant;
   disposing a second semiconductor die over the first semiconductor die opposite the interconnect structure;
   forming an opening in the first encapsulant adjacent to the first semiconductor die and over the interconnect structure; and
   forming a bond wire in the opening in the first encapsulant and coupled between the second semiconductor die and interconnect structure.

2. The method of claim 1, further including depositing a second encapsulant over the second semiconductor die and bond wire.

3. The method of claim 1, further including disposing a modular interconnect structure adjacent to the first semiconductor die.

4. The method of claim 3, further including:
   depositing the first encapsulant over the modular interconnect structure; and
   forming the opening extending to the modular interconnect structure.

5. The method of claim 1, further including forming the opening extending through the first encapsulant to the interconnect structure.

6. A semiconductor device, comprising:
   a first semiconductor die;
   a first encapsulant deposited over and covering a side surface of the first semiconductor die including an opening formed through the encapsulant;
   a first interconnect structure formed over the first encapsulant and first semiconductor die and extending over the opening;
   a second semiconductor die disposed over the first semiconductor die and first encapsulant; and a bond wire extending from the second semiconductor die and through the opening in the first encapsulant to couple the second semiconductor die to the first interconnect structure.

7. The semiconductor device of claim 6, further including a modular interconnect structure including a conductive via disposed in the first encapsulant.

8. The semiconductor device of claim 6, further including a second encapsulant deposited over the second semiconductor die and bond wire.

9. The semiconductor device of claim 6, further including a cap disposed over an active region of the second semiconductor die.

10. The semiconductor device of claim 6, wherein the second semiconductor die includes a microelectromechanical system.

11. The semiconductor device of claim 6, wherein the bond wire is mechanically bonded to the first semiconductor die and first interconnect structure.

12. A semiconductor device comprising:
    a first semiconductor die including an active surface;
    a first encapsulant disposed over the first semiconductor die opposite the active surface, the first encapsulant including an opening;
    a bond wire mechanically bonded to the active surface of the first semiconductor die and extending through the opening in the first encapsulant; and
    a modular interconnect structure including a conductive via disposed in the first encapsulant.

13. The semiconductor device of claim 12, further including a second semiconductor die disposed in the encapsulant over the first semiconductor die.

14. The semiconductor device of claim 12, further including a lid formed over the first semiconductor die.

15. The semiconductor device of claim 13, further including a first interconnect structure formed over the encapsulant opposite the first semiconductor die, wherein the second semiconductor die is coupled to the first semiconductor die through the first interconnect structure and bond wire.

16. The semiconductor device of claim 13, wherein the first semiconductor die is mounted directly to the second semiconductor die with a die attach adhesive.

17. A method of making a semiconductor device, comprising:
    depositing an encapsulant over a substrate;
    disposing a first semiconductor die over a first surface of the encapsulant with an active surface of the first semiconductor die oriented away from the encapsulant;
    forming a first interconnect structure over a second surface of the encapsulant opposite the first surface;
    forming an opening through the encapsulant; and
    forming a second interconnect structure extending from the first semiconductor die to the first interconnect structure through the opening of the encapsulant.

18. The method of claim 17, further including disposing a second semiconductor die on the substrate prior to depositing the encapsulant.

19. The method of claim 18, further including disposing a modular interconnect structure on the substrate prior to depositing the encapsulant.

20. The method of claim 17, further including disposing a cap over an active region of the first semiconductor die.

21. The method of claim 17, wherein forming the second interconnect structure includes forming a bond wire.

22. The method of claim 21, further including forming a conductive layer in the opening prior to forming the bond wire.

23. The method of claim 17, wherein the active surface of the first semiconductor die includes a sensor.

\* \* \* \* \*